United States Patent
Luo et al.

(10) Patent No.: US 11,937,430 B2
(45) Date of Patent: Mar. 19, 2024

(54) INTEGRATED ASSEMBLIES AND METHODS OF FORMING INTEGRATED ASSEMBLIES

(71) Applicant: Lodestar Licensing Group LLC, Evanston, IL (US)

(72) Inventors: Shuangqiang Luo, Boise, ID (US); Indra V. Chary, Boise, ID (US)

(*) Notice: Subject to any disclaimer, the term of this patent is extended or adjusted under 35 U.S.C. 154(b) by 42 days.

(21) Appl. No.: 17/841,624

(22) Filed: Jun. 15, 2022

(65) Prior Publication Data

US 2022/0320137 A1 Oct. 6, 2022

Related U.S. Application Data

(62) Division of application No. 16/885,720, filed on May 28, 2020, now Pat. No. 11,398,498.

(51) Int. Cl.
  *H10B 43/27* (2023.01)
  *H10B 41/27* (2023.01)
  *H10B 41/35* (2023.01)
  *H10B 43/35* (2023.01)

(52) U.S. Cl.
  CPC ............ *H10B 43/27* (2023.02); *H10B 41/27* (2023.02); *H10B 41/35* (2023.02); *H10B 43/35* (2023.02)

(58) Field of Classification Search
  None
  See application file for complete search history.

(56) References Cited

U.S. PATENT DOCUMENTS

| | | | |
|---|---|---|---|
| 8,809,938 B2 | 8/2014 | Hwang | |
| 9,691,444 B2 | 6/2017 | Hollis | |
| 10,141,322 B2 | 11/2018 | Simsek-Ege | |
| 10,283,493 B1 | 5/2019 | Nishida | |
| 10,325,922 B2 | 6/2019 | Lim | |
| 10,403,632 B2 | 9/2019 | Ogawa | |
| 2017/0033117 A1 | 2/2017 | Lee | |
| 2017/0062454 A1 | 3/2017 | Lu | |
| 2019/0378855 A1* | 12/2019 | Kim | H10B 43/10 |
| 2020/0111803 A1 | 4/2020 | Baek | |
| 2021/0143176 A1 | 5/2021 | Yun | |

FOREIGN PATENT DOCUMENTS

| | | |
|---|---|---|
| CN | 105280606 | 1/2016 |
| CN | 108987272 | 12/2018 |
| CN | 110137178 | 8/2019 |
| CN | 111009528 | 4/2020 |
| KR | 10-2018-0033304 | 4/2018 |

(Continued)

*Primary Examiner* — Hsien Ming Lee

(74) *Attorney, Agent, or Firm* — Brooks, Cameron & Huebsch, PLLC

(57) ABSTRACT

Some embodiments include an integrated assembly having a first deck, a second deck over the first deck, and a third deck over the second deck. The first deck has first conductive levels disposed one atop another. The second deck has second conductive levels disposed one atop another. The third deck has third conductive levels disposed one atop another. A first staircase region extends to the first and second conductive levels, and passes through the third conductive levels. A second staircase region extends to the third conductive levels and not to the first and second conductive levels. Some embodiments include methods of forming integrated assemblies.

25 Claims, 34 Drawing Sheets

(56) References Cited

FOREIGN PATENT DOCUMENTS

| TW | 201214655 | 4/2012 |
|---|---|---|
| WO | WO 2015/094535 A1 | 6/2015 |
| WO | WO 2019/143400 | 7/2019 |
| WO | WO PCT/US2021/030463 | 8/2021 |
| WO | WO PCT/US2021/030463 | 11/2022 |

* cited by examiner

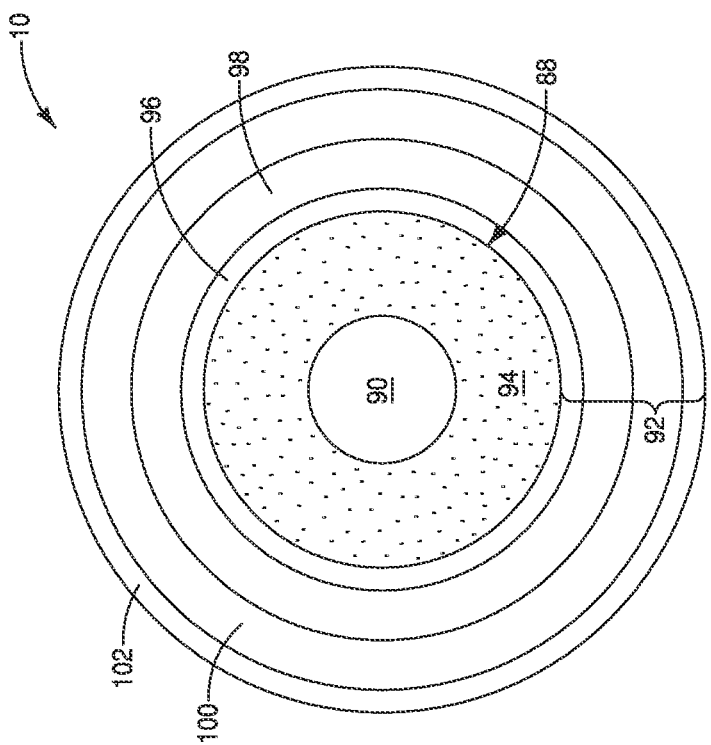
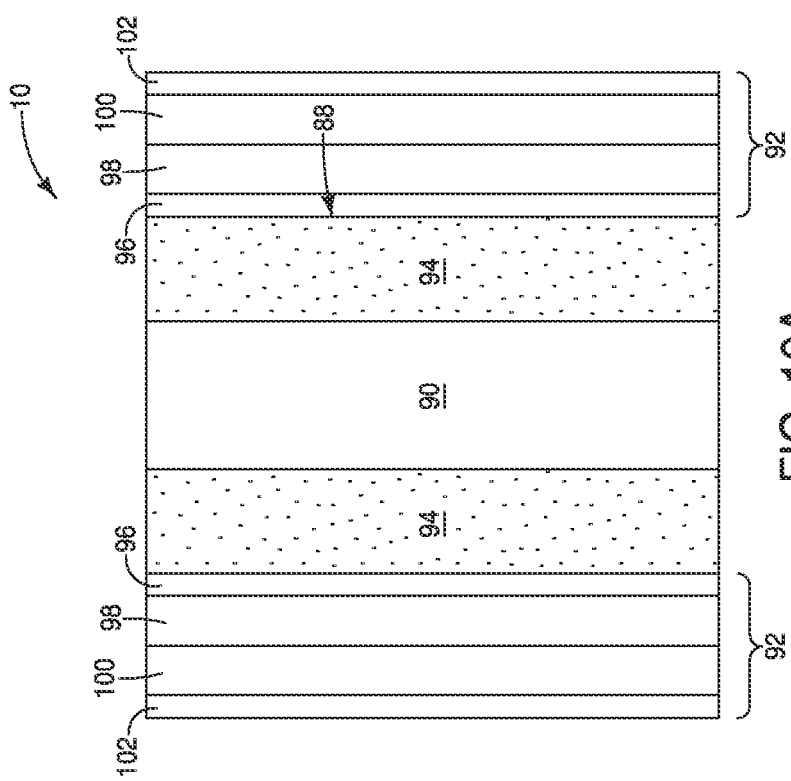

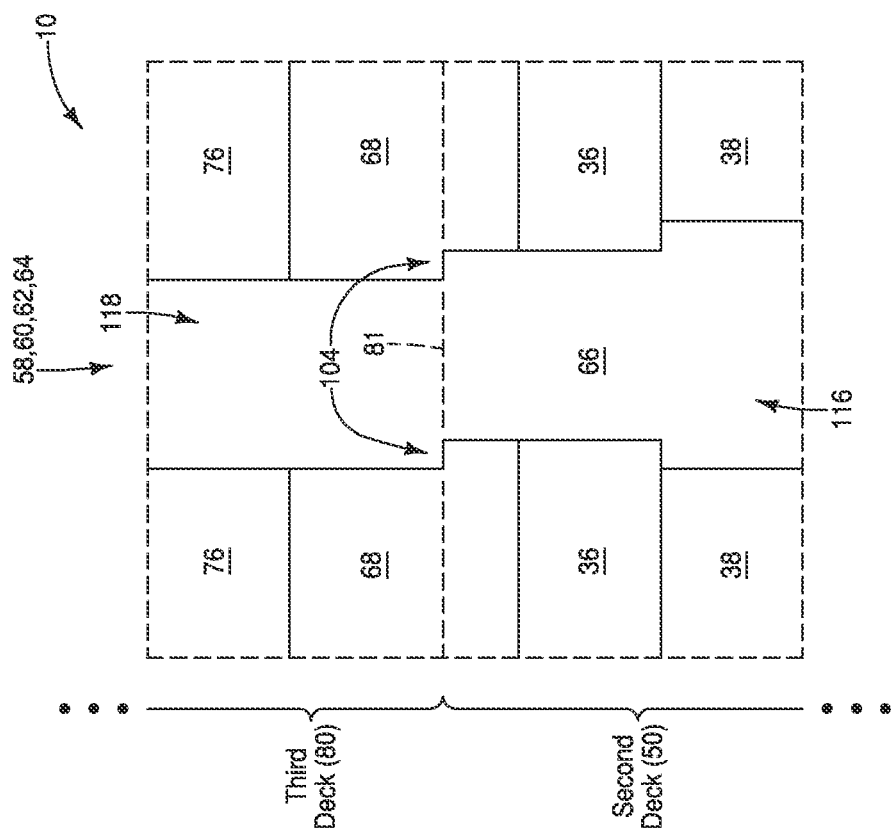
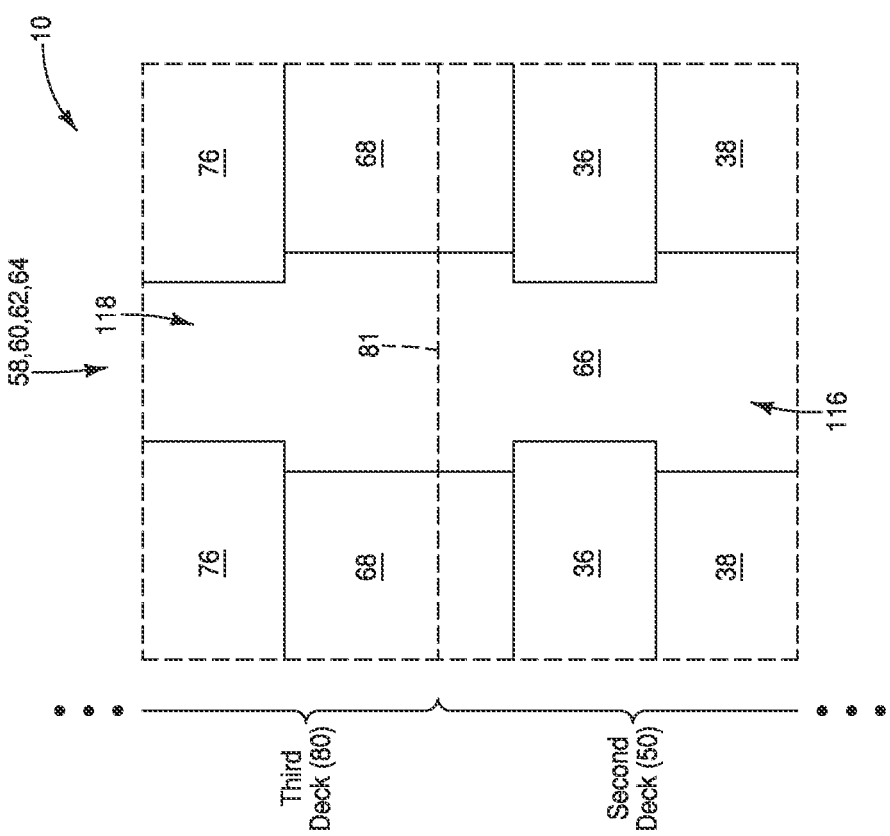

INTEGRATED ASSEMBLIES AND METHODS OF FORMING INTEGRATED ASSEMBLIES

RELATED PATENT DATA

This patent resulted from divisional application of U.S. patent application Ser. No. 16/885,720, filed May 28, 2020, the disclosure of which is incorporated herein by reference.

TECHNICAL FIELD

Integrated assemblies (e.g., NAND assemblies), and methods of forming integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a block diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_J$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It is desired to develop improved NAND architecture and improved methods for fabricating NAND architecture.

BRIEF DESCRIPTION OF THE DRAWINGS

FIG. 19A is a diagrammatic cross-sectional side view of a region of FIG. 19.

FIG. 19B is a diagrammatic top-down view of the region of FIG. 19A.

FIG. 20A is a diagrammatic cross-sectional side view of a region of FIG. 20.

FIG. 20B is a diagrammatic cross-sectional side view of a region similar to that of FIG. 20A in accordance with another example embodiment.

DETAILED DESCRIPTION OF THE ILLUSTRATED EMBODIMENTS

Some embodiments include methods of forming memory with three or more decks stacked one atop another, and some embodiments include configurations having three or more decks stacked one atop another. Example embodiments are described with reference to FIGS. 5-29. It is noted that many of the cross-sectional side views show multiple regions which are not generally in the same plane as one another, but which are shown in the same plane to simplify the drawings. Such will be explained in greater detail below relative to FIGS. 28 and 28A.

Figure 1:
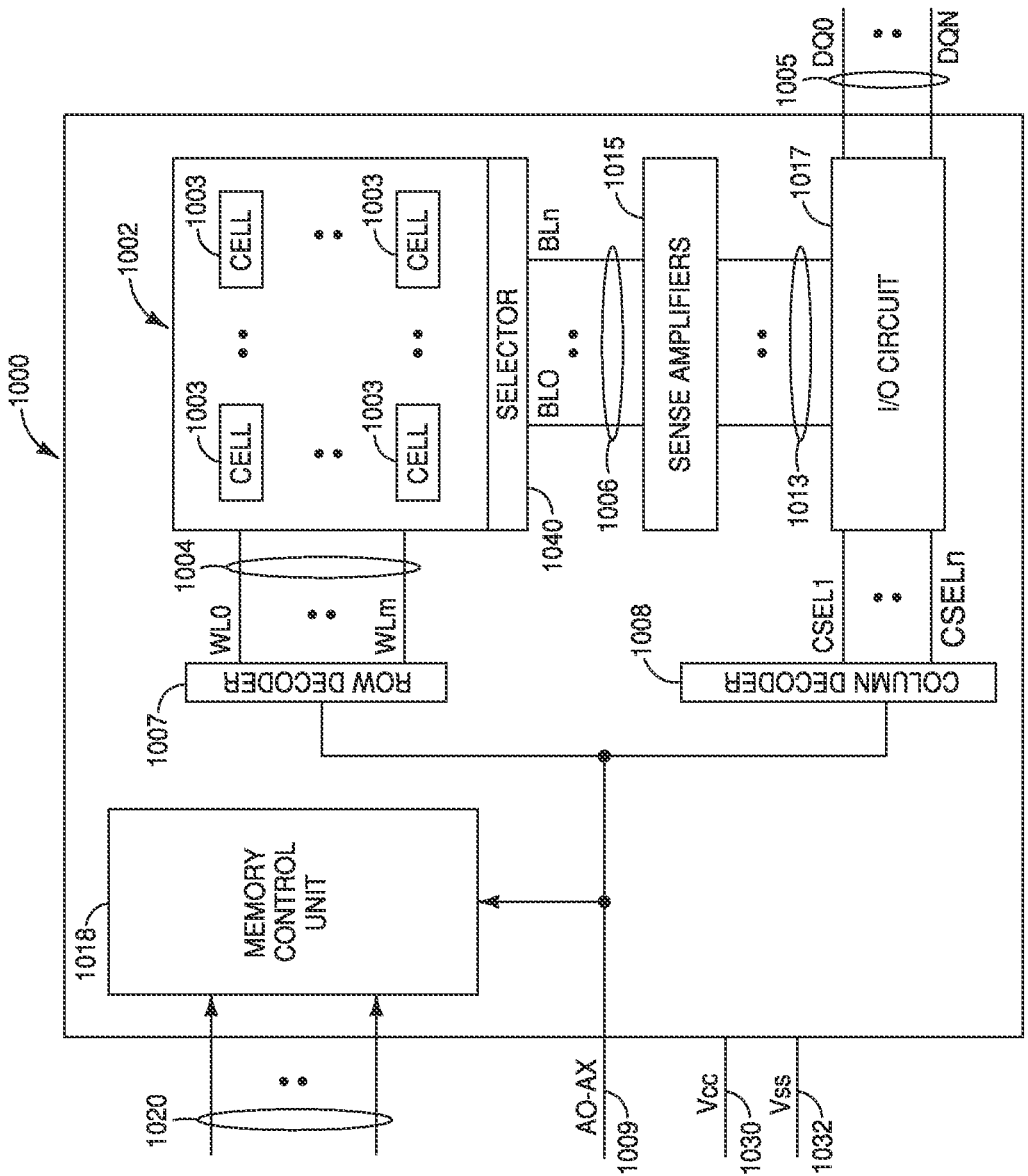
FIG. 1 shows a block diagram of a prior art memory device having a memory array with memory cells.
Figure 2:
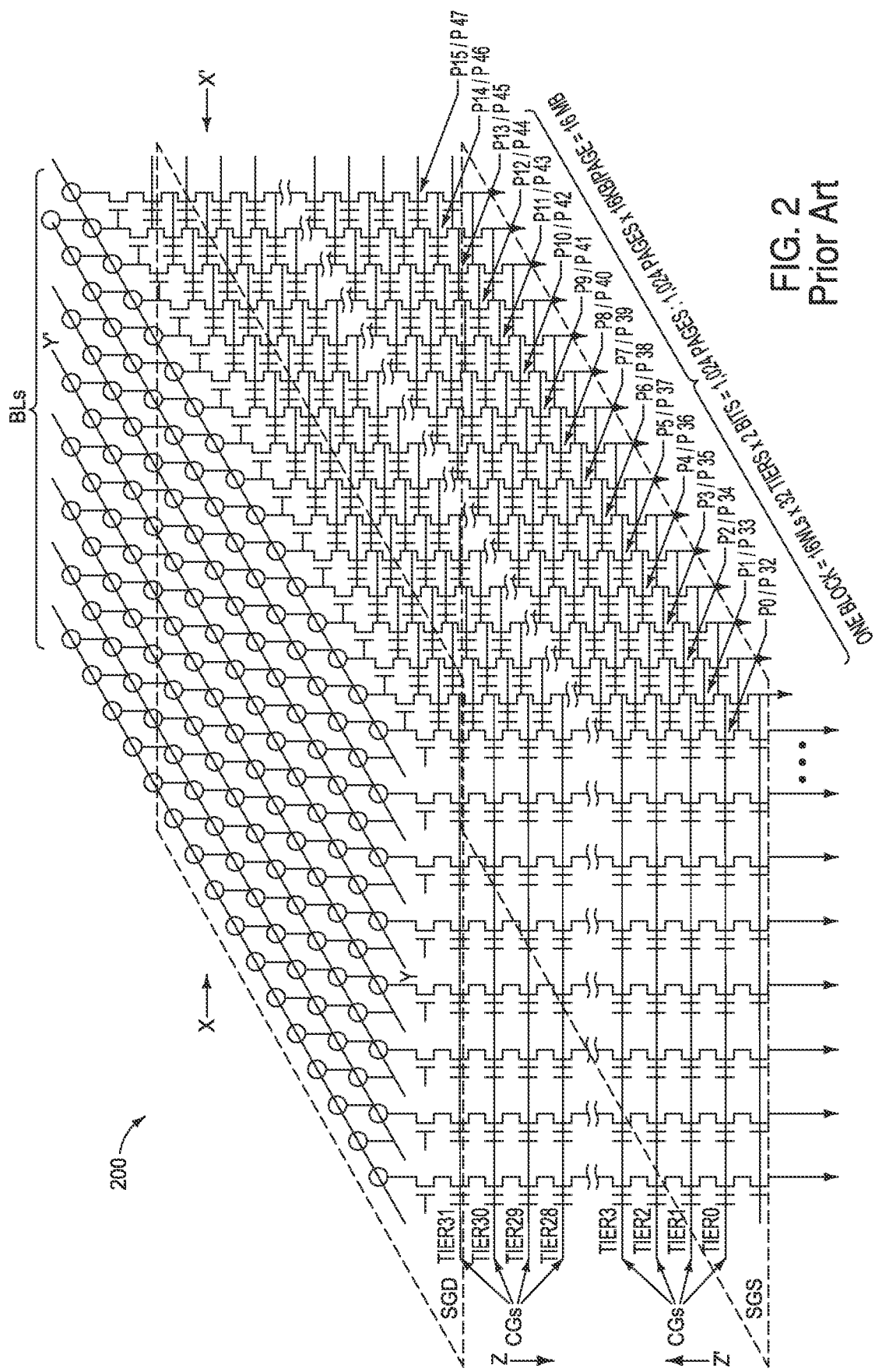
FIG. 2 shows a schematic diagram of the prior art memory array of FIG. 1 in the form of a 3D NAND memory device.
Figure 3:
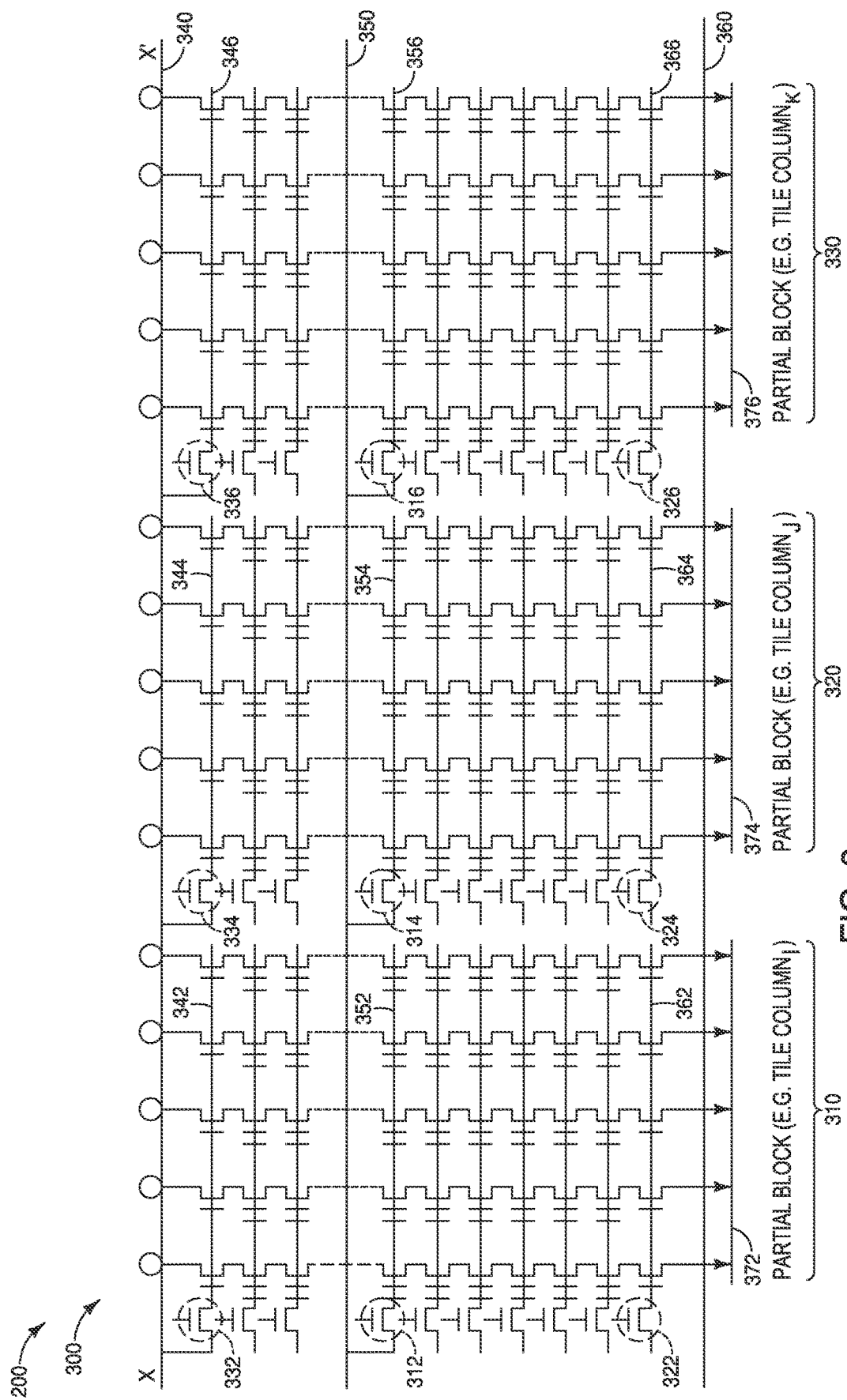
FIG. 3 shows a cross-sectional view of the prior art 3D NAND memory device of FIG. 2 in an X-X' direction.
Figure 4:
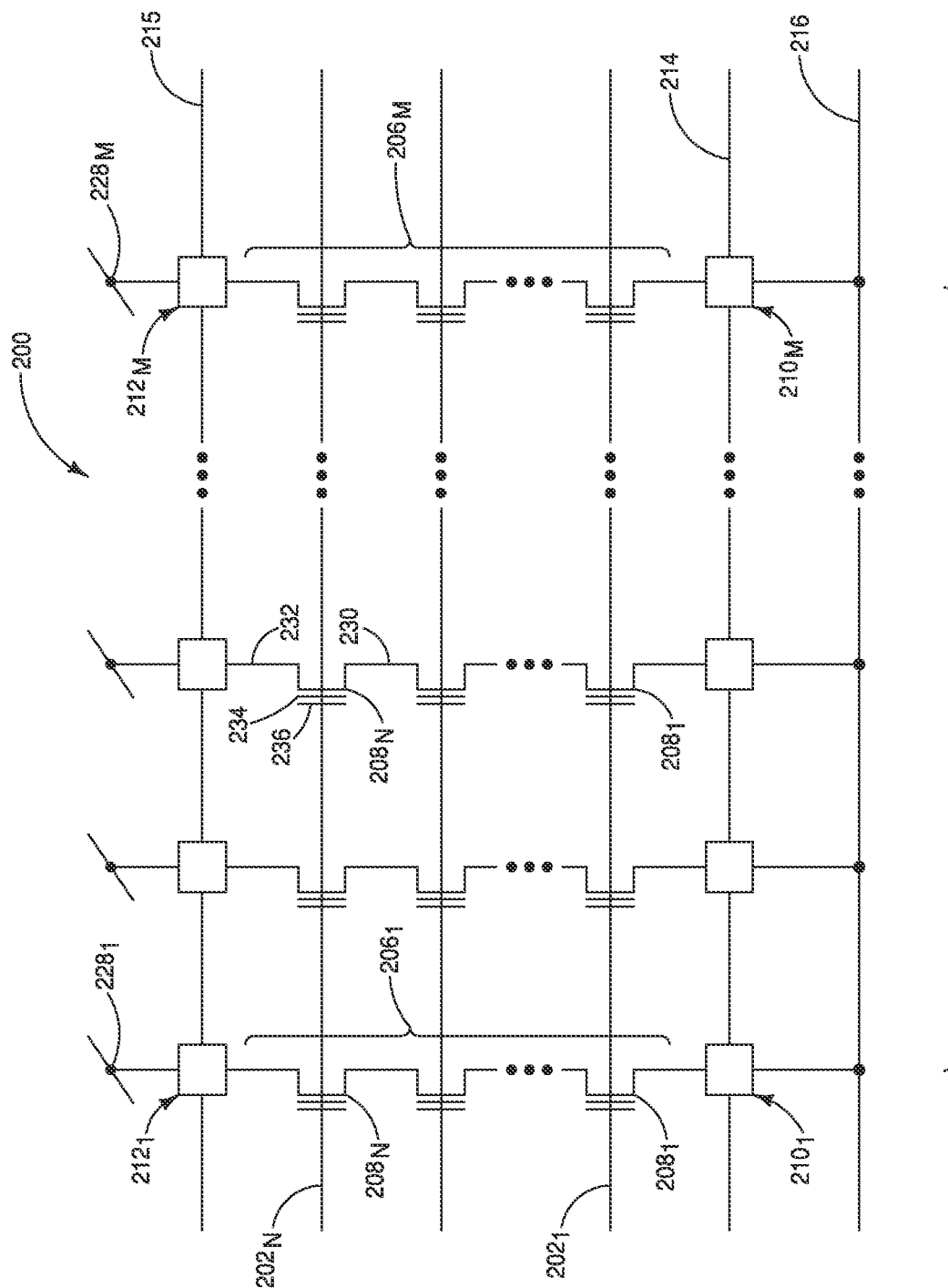
FIG. 4 is a schematic diagram of a prior art NAND memory array.
Figure 5:
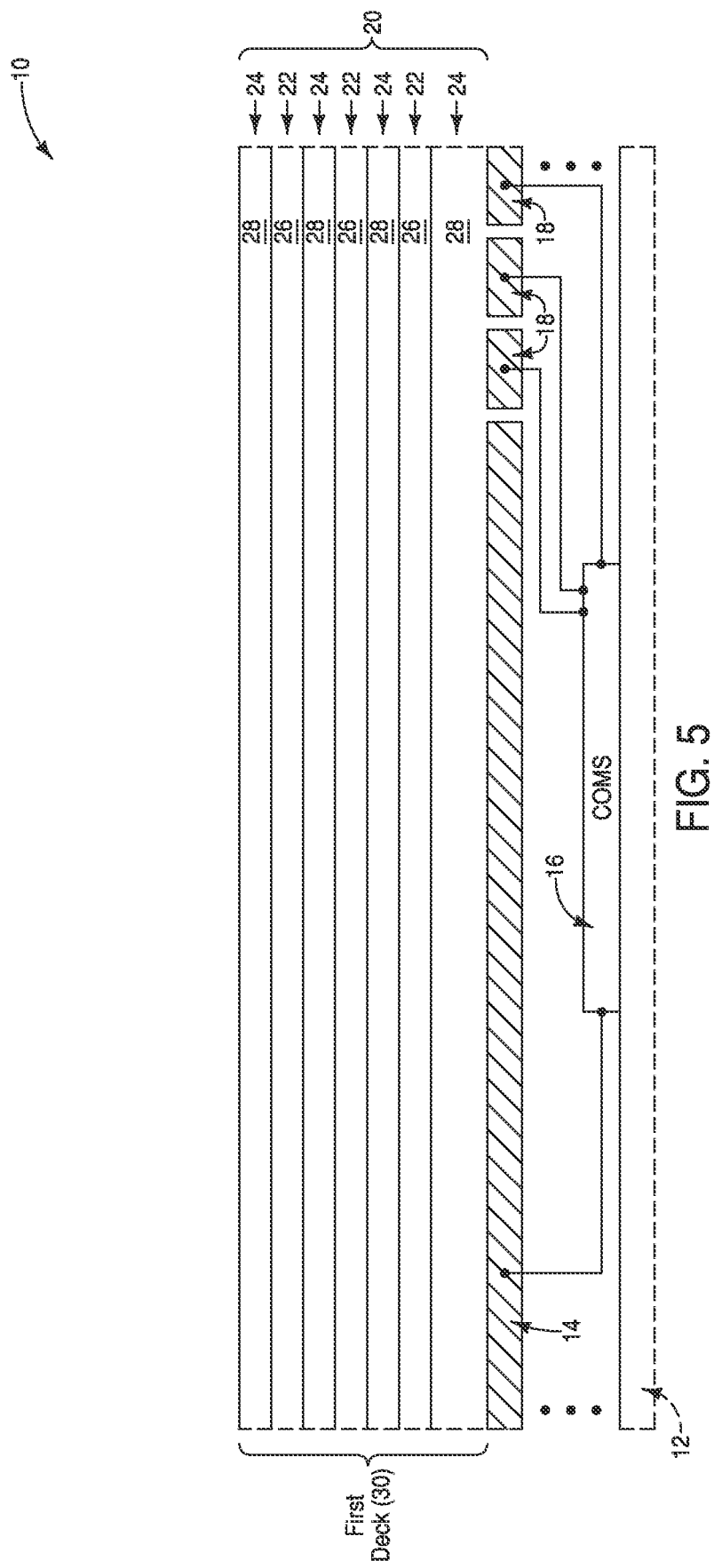
FIGS. 5-10 are diagrammatic cross-sectional side views of a region of an integrated assembly at example sequential process stages of an example method for forming an example memory array.

Referring to FIG. 5, an assembly 10 includes a conductive structure 14 supported by a base 12.

The conductive structure 14 may be a source structure analogous to the source structures 216 and 360 described above in the Background section. The conductive structure 14 may comprise any suitable electrically conductive composition(s), and in some embodiments may comprise conductively-doped semiconductor material. The conductively-doped semiconductor material may be conductively-doped silicon (e.g., n-type silicon). The conductively-doped semiconductor material of the source structure 14 may be over one or more additional conductive materials of the source structure 14 (e.g., one or more metal-containing materials, such as, for example, one or both of tungsten and tungsten silicide).

The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc.

The base 12 is spaced from the conductive structure 14 by a gap. Such gap is utilized to indicate that there may be one or more additional components, structures, etc., between the conductive structure 14 and the base 12. In the illustrated embodiment, logic circuitry (e.g., CMOS) 16 is supported by the base 12, and is within the gap between the base 12 and the conductive structure 14. The conductive structure 14 is shown to be electrically coupled to the CMOS.

In the illustrated embodiment of FIG. 5, additional conductive structures 18 are laterally adjacent to the source structure 14. The additional conductive structures 18 are also electrically coupled with the CMOS 16. The additional conductive structures may be conductive landing pads utilized to couple conductive features (some of which are described below with reference to FIG. 22) with the CMOS 16. Although all of the conductive structures 18 are shown to be electrically coupled with the CMOS, in other embodiments one or more of the structures 18 may not be coupled with the CMOS. The structures 18 which are not coupled with the CMOS may be provided as support structures.

A stack 20 of alternating first and second tiers (levels, layers) 22 and 24 is formed over the conductive structures 14 and 18. The stack 20 may comprise any suitable number of alternating tiers 22 and 24. The tiers 22 ultimately become conductive levels of a memory arrangement. There may be any suitable number of tiers 22 to form the desired number of conductive levels. In some embodiments, the number of tiers 22 may be 8, 16, 32, 64, etc.

The first tiers 22 comprise a first material 26. Such first material may comprise any suitable composition(s), and in some embodiments may comprise, consist essentially of, or consist of silicon nitride.

The second tiers 24 comprise a second material 28. Such material may be an insulative material and may comprise any suitable composition(s). In some embodiments, the material 28 may comprise, consist essentially of, or consist of silicon dioxide.

In some embodiments, the materials 26 and 28 may be referred to as a first material and an insulative second material, respectively.

The tiers 22 and 24 may be of any suitable thicknesses; and may be the same thickness as one another, or may be different thicknesses relative to one another. In some embodiments, the tiers 22 and 24 may have vertical thicknesses within a range of from about 10 nanometers (nm) to about 400 nm. In the illustrated embodiment, the bottom-most tier 24 is thicker than the other tiers 24. In other embodiments, the bottommost tier 24 may have a thickness which is about the same as the thickness of the other tiers 24, or may be less thick than the other tiers 24.

In some embodiments, the stack 20 may be referred to as a first stack to distinguish from additional stacks formed at later process stages. The first stack 20 may be considered to be comprised by a first deck 30.

Figure 6:
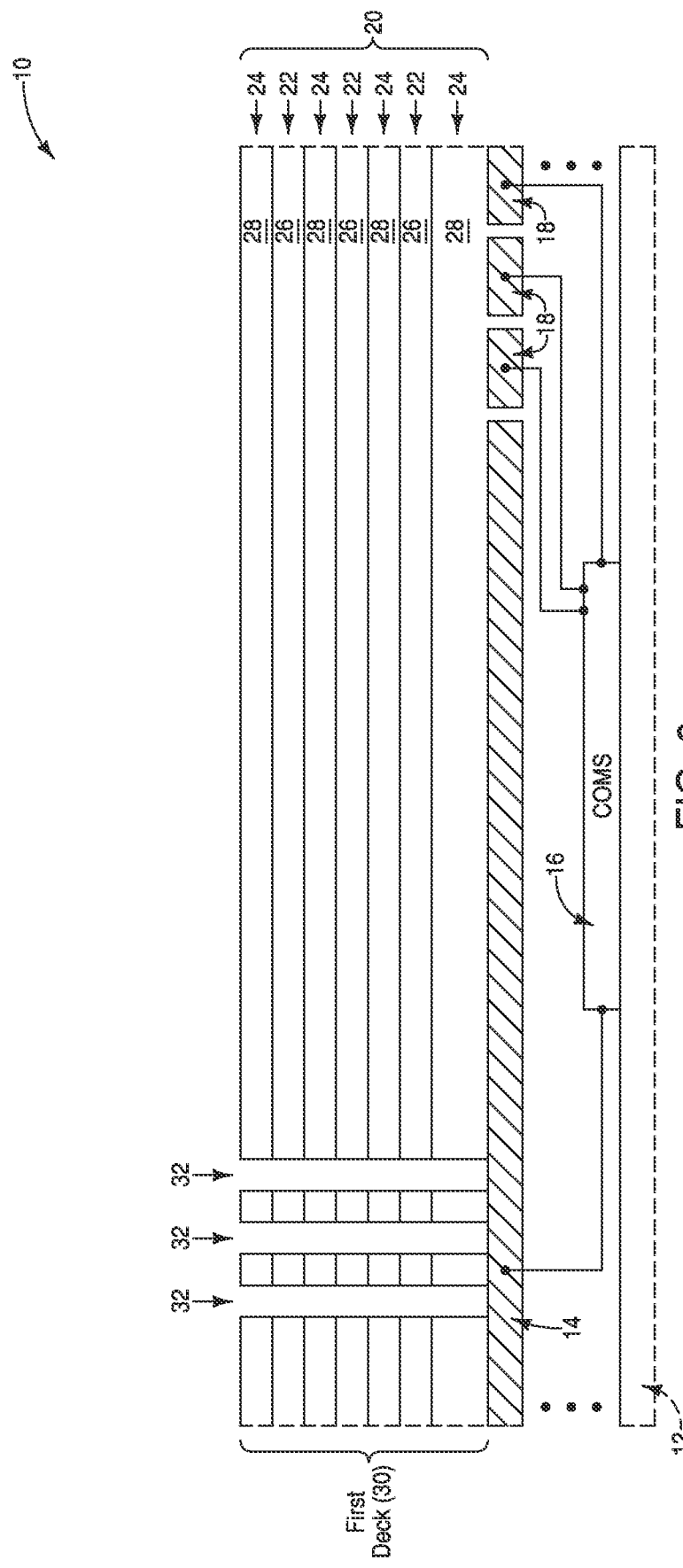

Referring to FIG. 6, first openings 32 are formed to extend through the first stack 20. In the shown embodiment, the first openings 20 extend downwardly to an upper surface of the source structure 14.

Figure 7:
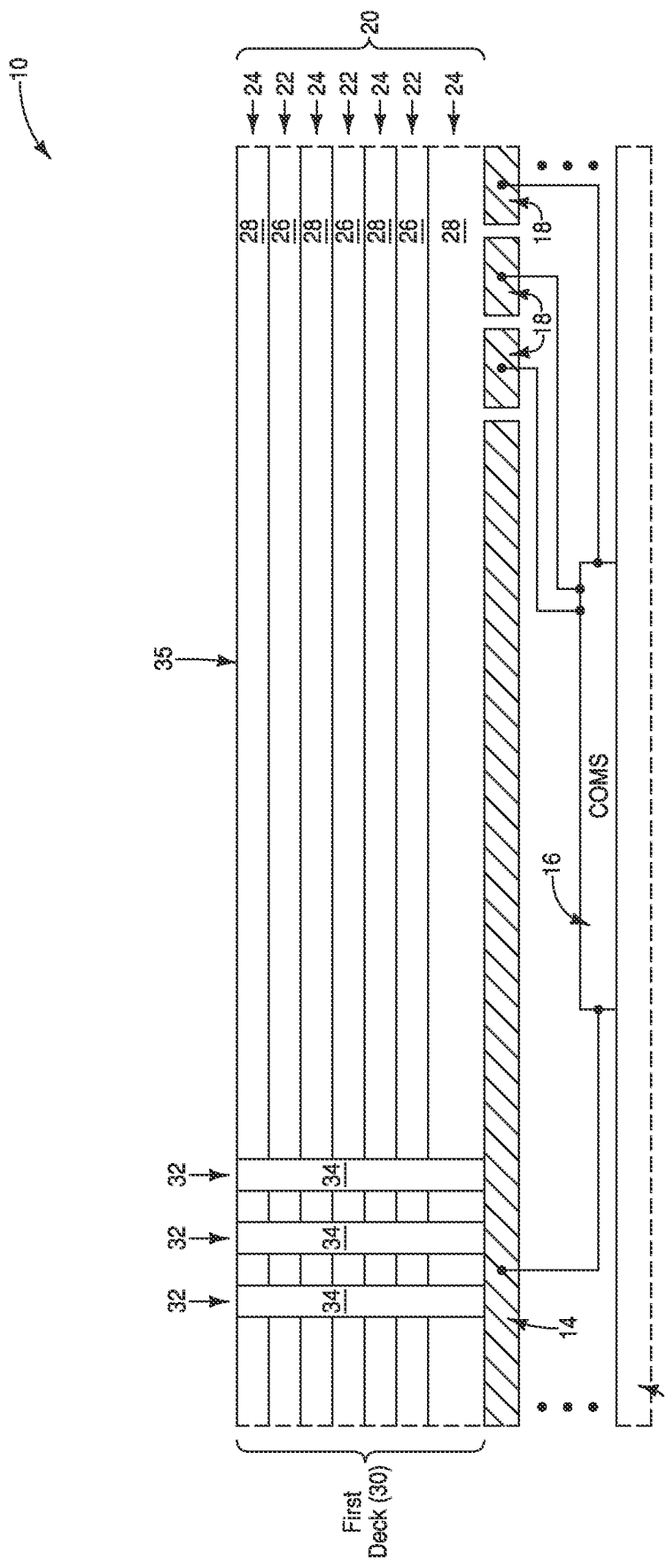

Referring to FIG. 7, sacrificial material 34 is formed within the first openings 32. The sacrificial material 34 may comprise any suitable composition(s), and in some embodiments may comprise, consist essentially of, or consist of one or more of metal (e.g., tungsten), undoped semiconductor material (e.g., doped silicon), etc.

In the shown embodiment, a planarized surface 35 is formed to extend across the sacrificial material 34 and the upper tier 24. The planarized surface 35 may be formed with any suitable processing, including, for example, chemical-mechanical polishing (CMP).

Figure 8:
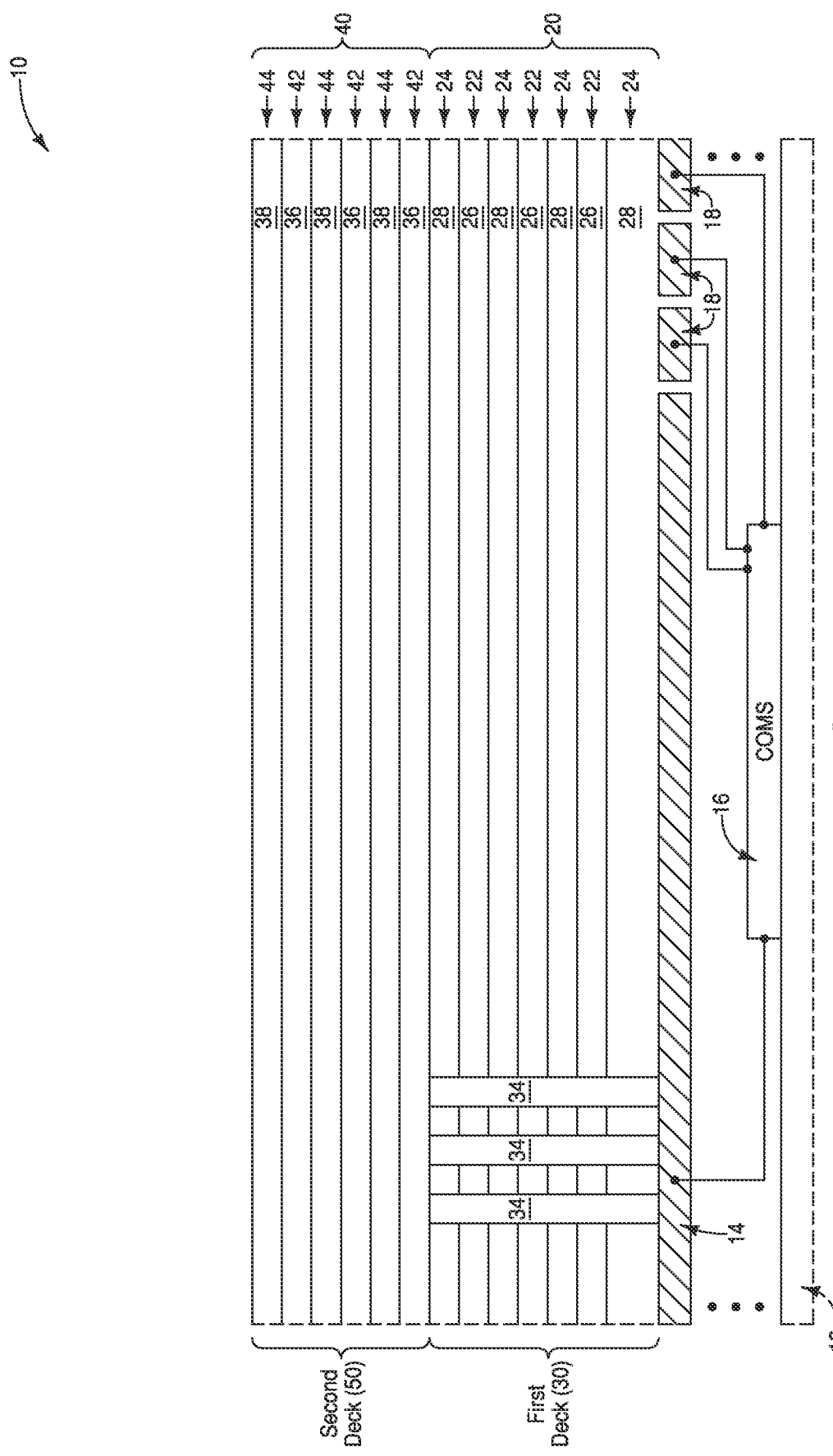

Referring to FIG. 8, a second stack 40 of alternating third and fourth tiers (levels, layers) 42 and 44 is formed over the first stack 20. The stack 40 may comprise any suitable number of alternating tiers 42 and 44. The tiers 42 ultimately become conductive levels of a memory arrangement. There may be any suitable number of tiers 42 to form the desired number of conductive levels. In some embodiments, the number of tiers 42 may be 8, 16, 32, 64, etc.

The third tiers 42 comprise a third material 36. Such third material may comprise any suitable composition(s), and in some embodiments may comprise, consist essentially of, or consist of silicon nitride. Accordingly, the third material 36 may comprise a same composition as the first material 26.

The fourth tiers 44 comprise a fourth material 38. Such material may be an insulative material and may comprise any suitable composition(s). In some embodiments, the fourth material 38 may comprise, consist essentially of, or consist of silicon dioxide. In some embodiments, the insulative fourth material 38 may comprise a same composition as the insulative second material 28.

The tiers 42 and 44 may have the same thicknesses described above relative to the tiers 22 and 24.

The second stack 40 may be considered to be comprised by a second deck 50.

Figure 9:
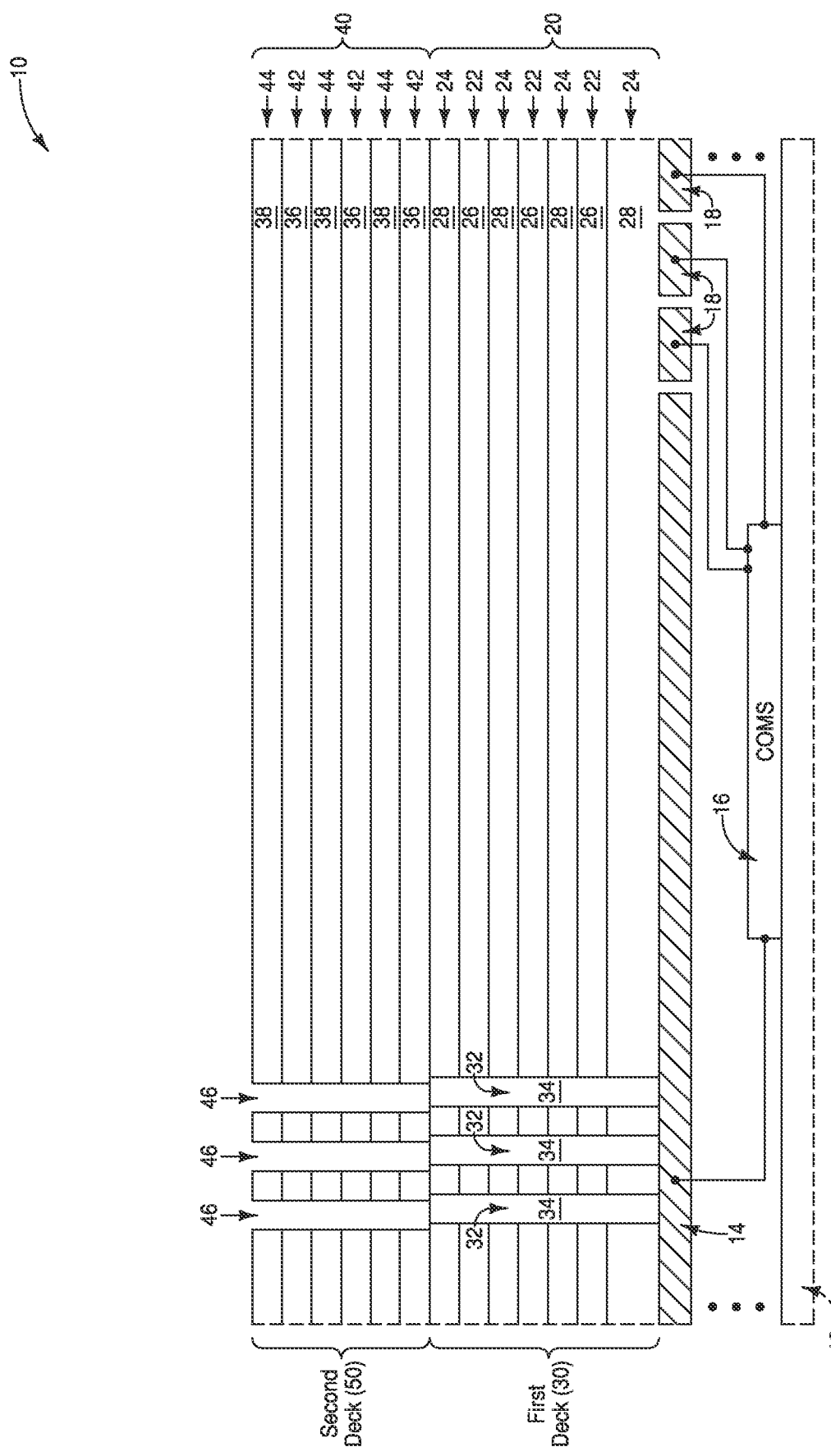

Referring to FIG. 9, second openings 46 are formed to extend through the second stack 40 to the first openings 32.

In the shown embodiment, the second openings 46 extend to the sacrificial material 34 within the first openings 32.

The second openings 46 are misaligned relative to the first openings 32 in the illustrated embodiment of FIG. 9. In other embodiments, the second openings 46 may be aligned relative to the first openings 32.

Figure 10:
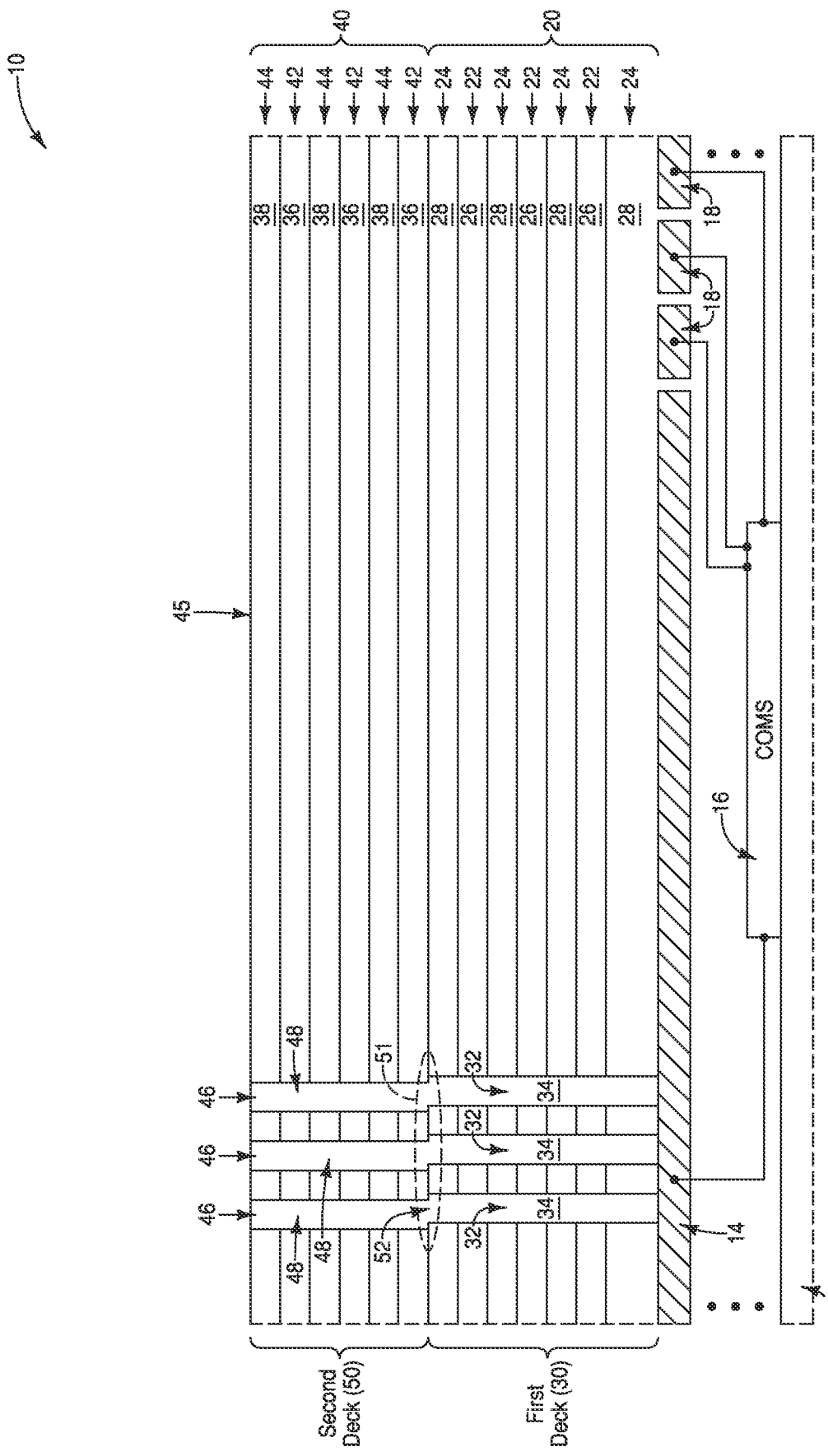

Referring to FIG. 10, additional sacrificial material 34 is formed within the second openings 46. The sacrificial material 34 within the openings 32 and 46 forms sacrificial structures 48.

Figure 10B:
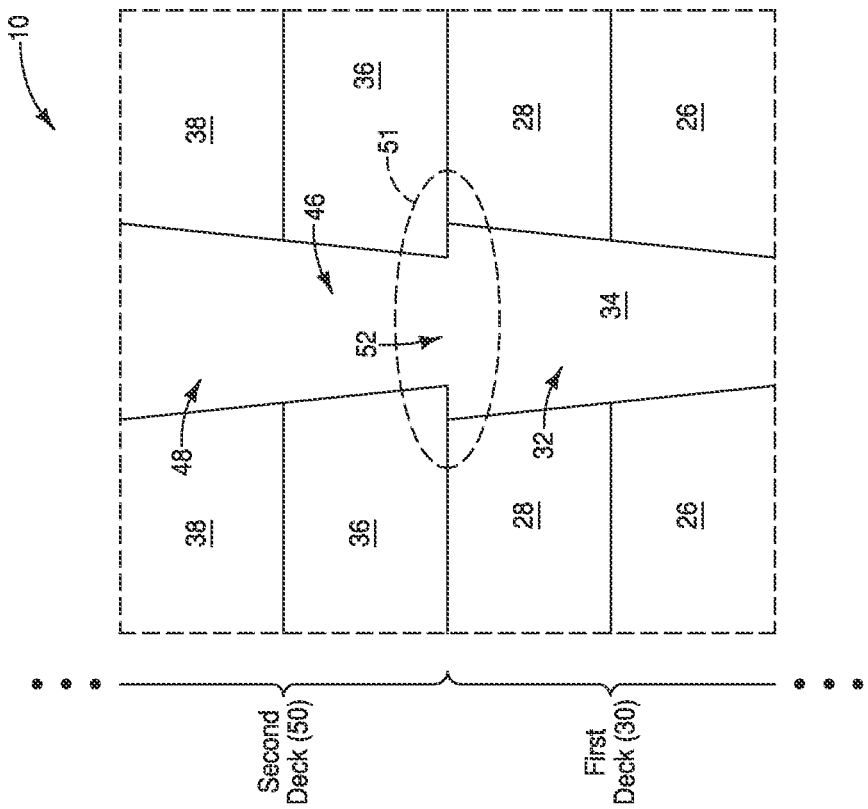
FIG. 10B is a diagrammatic cross-sectional side view of a region similar to that of FIG. 10A in accordance with another example embodiment.
Figure 10A:
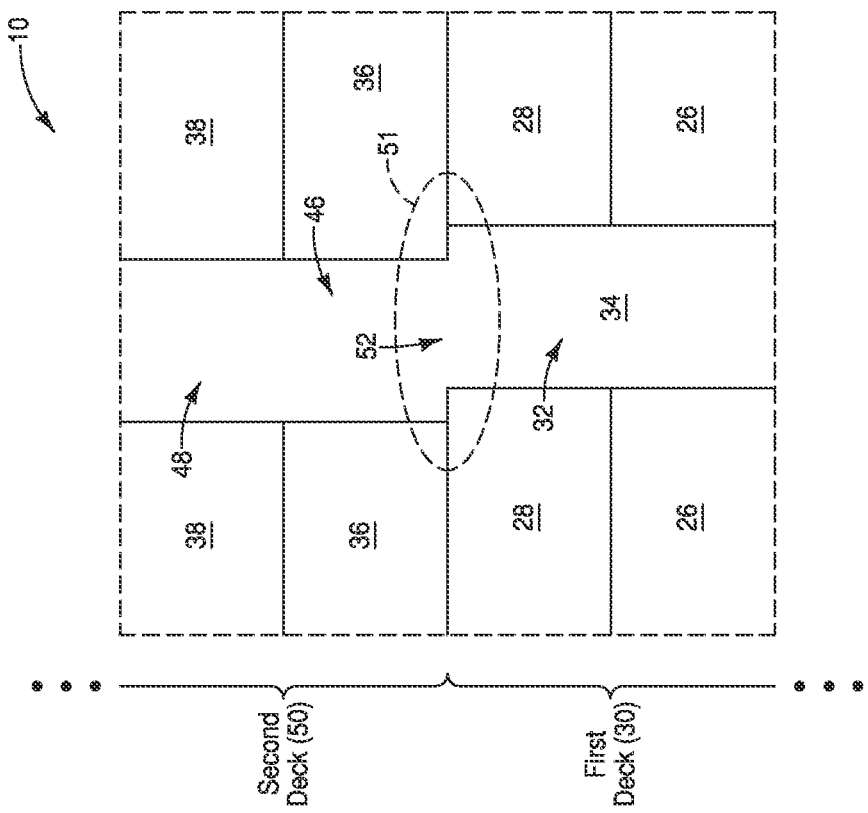
FIG. 10A is a diagrammatic cross-sectional side view of a region of FIG. 10.

An inter-deck region 51 is a diagrammatically indicated in FIG. 10. The structures 48 have inter-deck inflections 52 within the inter-deck region 51. FIG. 10A shows an enlarged view of a segment of one of the structures 48 within the inter-deck region 51 to more clearly illustrate the example inter-deck inflection 52. The illustrated inter-deck inflection 52 occurs where the opening 46 (the opening formed through the second deck 50) meets the opening 32 (the opening formed through the first deck 30), and is a result of the misalignment of the openings 46 and 32. Specifically, the inter-deck inflection 52 of FIG. 10A corresponds to a region where an upper portion of the sacrificial-material-structure 48 is laterally offset relative to a lower portion of the sacrificial-material-structure 48.

FIG. 10A shows an example of an inter-deck inflection that may be detected in a structure (e.g., structure 48) passing through two decks in a location where the decks join to one another. The inter-deck inflection results from one portion of the structure being formed during fabrication associated with the lower deck and another portion of the structure being formed during fabrication associated with the upper deck.

The inter-deck inflection may be considered to correspond to any detectable change in a region of a structure passing through an interface between two decks. Another example configuration of an inter-deck inflection 52 is shown in FIG. 10B. The configuration of FIG. 10B has the second opening 46 aligned with the first opening 32. However, the first and second openings are tapered during formation of such openings, and accordingly the inflection 52 occurs where a narrow portion of the tapered opening 48 joins to a wide portion of the tapered opening 32 within the inter-deck region 51.

Referring again to FIG. 10, a planarized surface 45 is formed across the sacrificial material 34 and the upper tier 44. The planarized surface 45 may be formed with any suitable processing, including, for example, CMP.

Figure 11:
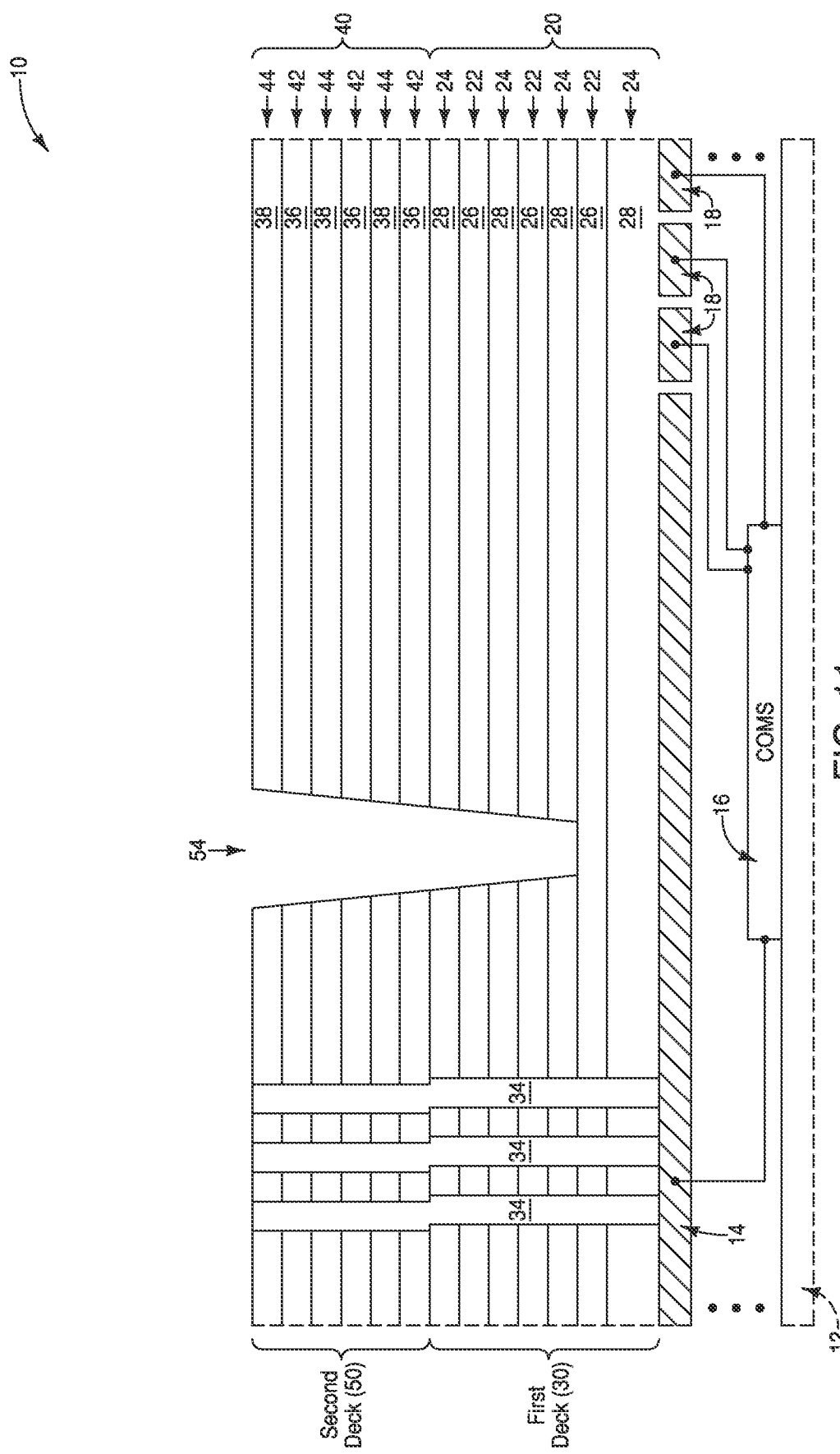
FIGS. 11-19 are diagrammatic cross-sectional side views of the region of the integrated assembly of FIG. 5 at example sequential process stages of an example method for forming an example memory array. The process stage of FIG. 11 may follow that of FIG. 10.

Referring to FIG. 11, a staircase opening 54 is formed to extend into the first and second stacks 20 and 40. In the illustrated embodiment, the staircase opening 54 extends to the lowermost of the first tiers 22 within the first deck 30.

Figure 12:
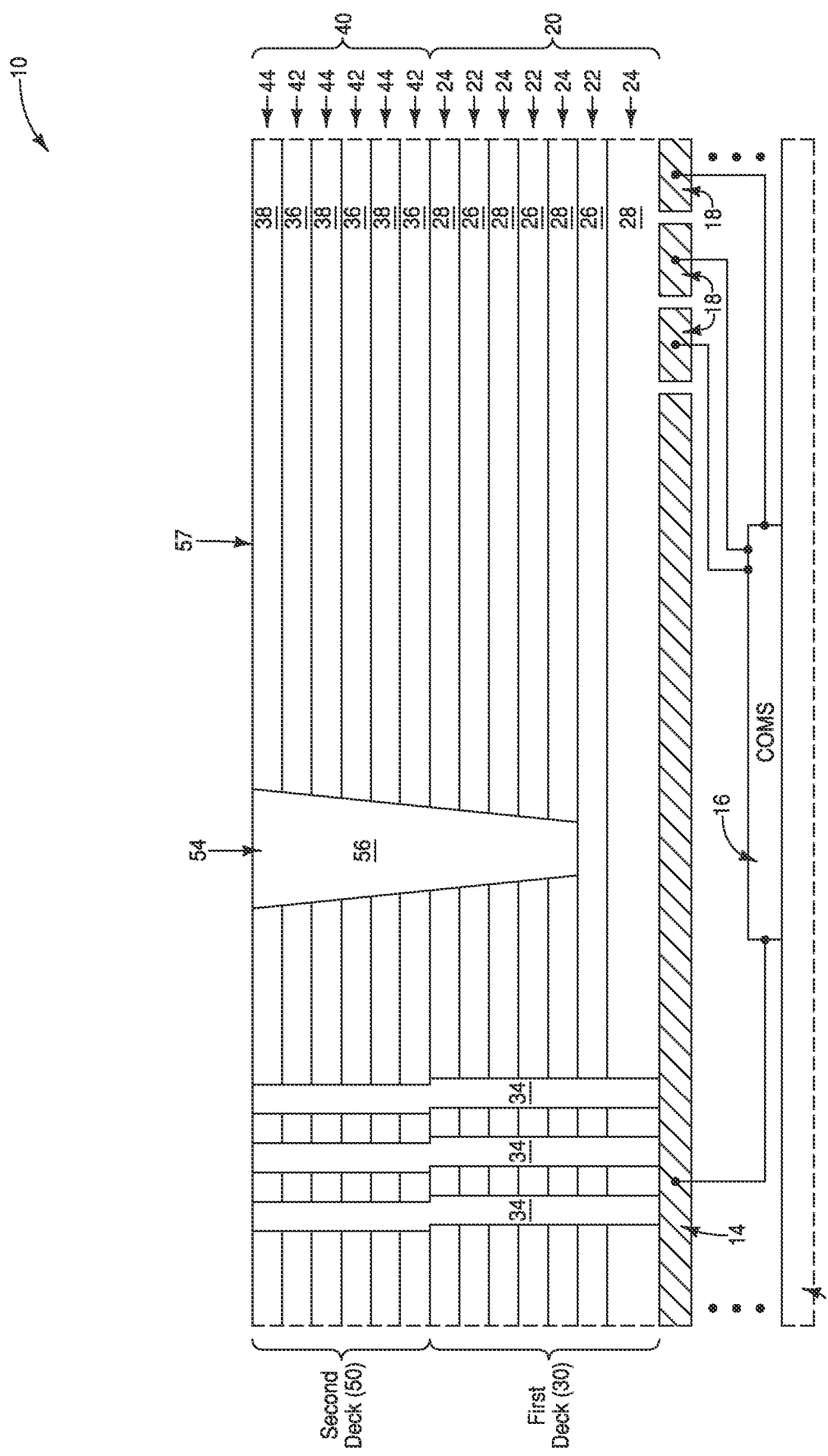

Referring to FIG. 12, sacrificial material 56 is formed within the staircase opening 54. The sacrificial material 56 may comprise any suitable composition(s), and in some embodiments may comprise a same composition as the sacrificial material 34.

A planarized surface 57 is formed to extend across the sacrificial material 56 and the uppermost tier 44. The surface 57 may be formed with any suitable processing, such as, for example, CMP.

Figure 13:
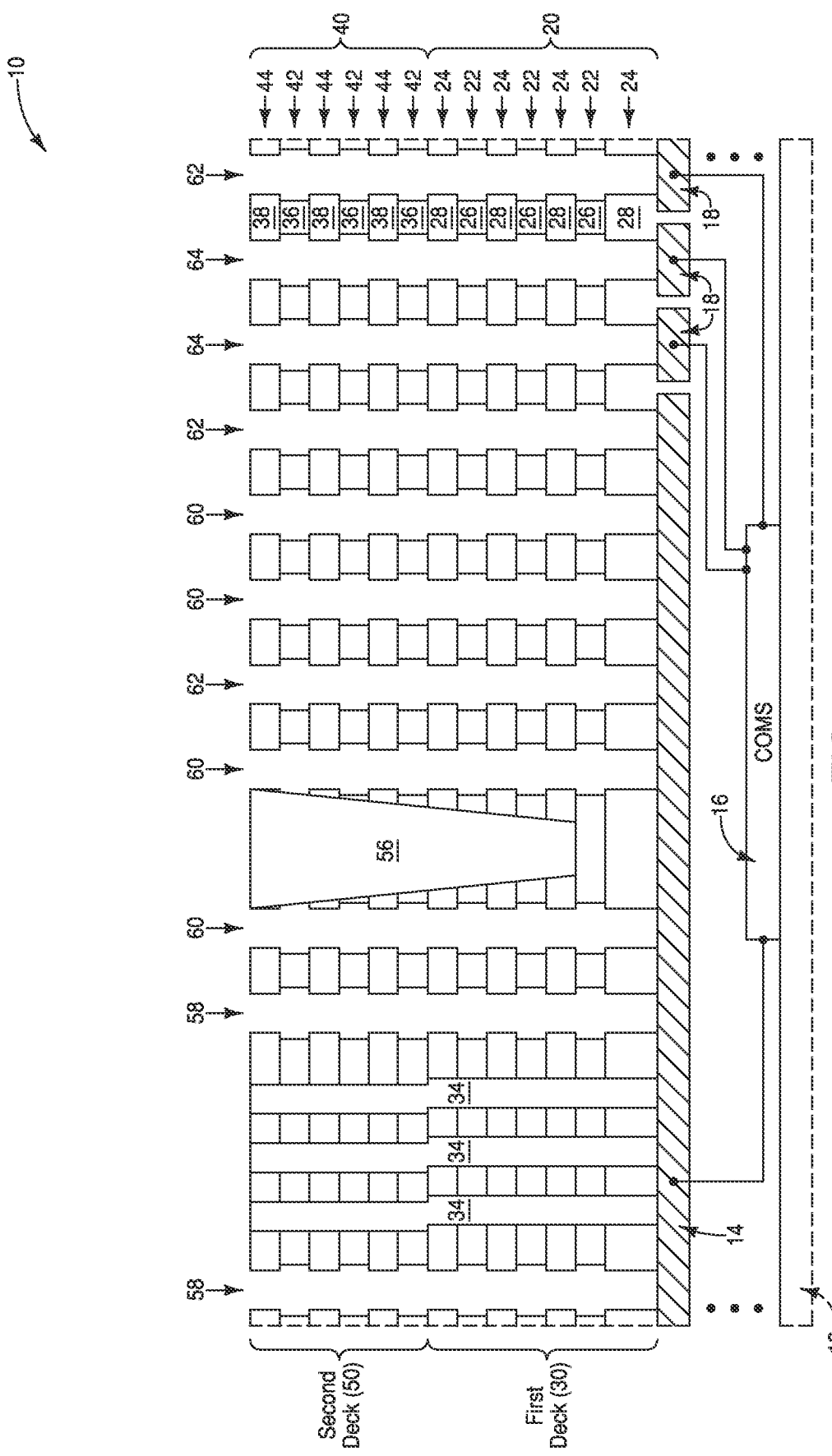

Referring to FIG. 13, openings 58, 60, 62 and 64 are formed to extend through the first and second decks 30 and 50, and to an upper surface of the conductive structure 14. In some embodiments, one or more of the openings 58, 60, 62 and 64 may extend into the conductive structure 14. In the illustrated embodiment, the materials 26 and 36 are recessed along sidewalls of the openings 58, 60, 62 and 64. Such recessing may be advantageous to increase the dimensions of the openings at locations along the tiers 22 and 42. In other embodiments, the materials 26 and 36 may not be recessed. Accordingly, the openings 58, 60, 62 and 64 may have substantially straight sidewalls rather than the illustrated undulating sidewalls.

The openings 58 may correspond to slits extending in and out of the page relative to the cross-sectional view of FIG. 13, as explained in more detail below with reference to FIG. 28A. The openings 60, 62 and 64 may have substantially the same configuration as one another (i.e., maybe circular, square-shaped, etc., when viewed from above, and may be about the same dimensions as one another), or may comprise different configurations relative to one another. The openings 60, 62 and 64 may be utilized for forming different structures relative to one another, and accordingly are given different labels relative to one another.

Figure 14:
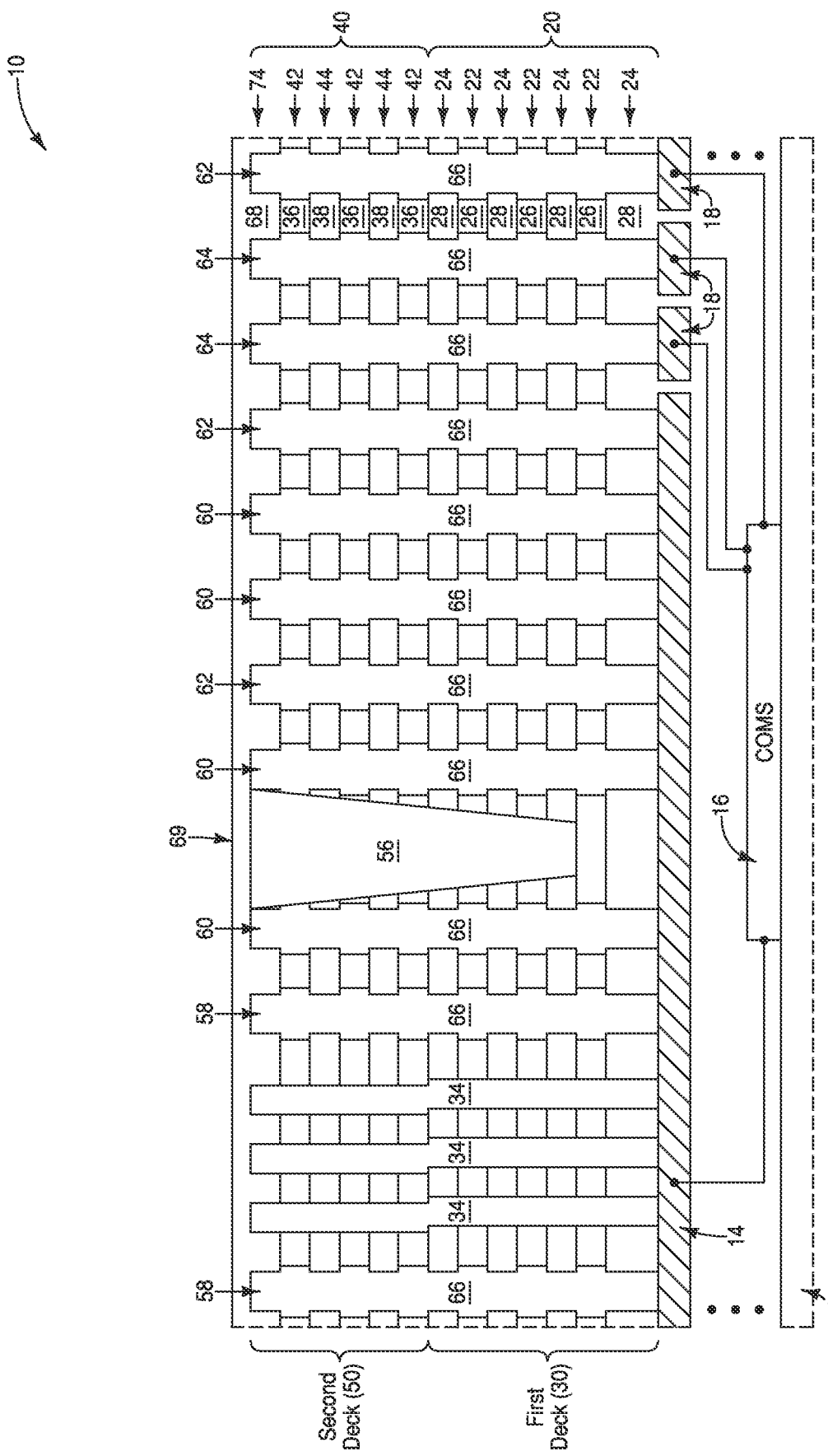

Referring to FIG. 14, sacrificial material 66 is formed within the openings 58, 60, 62 and 64. The sacrificial material 66 may comprise any suitable composition(s), and in some embodiments may comprise a same composition as the sacrificial material 34. In some embodiments, the sacrificial material 66 may comprise insulative material (e.g., porous silicon dioxide, carbon-doped silicon dioxide, silicon oxynitride, etc.).

An insulative material 68 is formed over the sacrificial material 66 and the uppermost tier 42. The insulative material 68 may comprise any suitable composition(s), and in some embodiments may comprise, consist essentially of, or consist of silicon dioxide. Accordingly, in some embodiments the insulative material 68 may comprise a same composition as the materials 28 and 38 of the tiers 24 and 44, and may comprise a same composition as the material 56.

The insulative material 68 is shown to have a planarized upper surface 69. The planarized surface 69 may be formed with any suitable processing, such as, for example, CMP.

The insulative material 68 may be considered formed over the second deck 50 (the second stack 40). In some embodiments, the insulative material 68 may be considered to be a tier 74 which is formed over the uppermost tier 42 of the stack 40.

Figure 15:
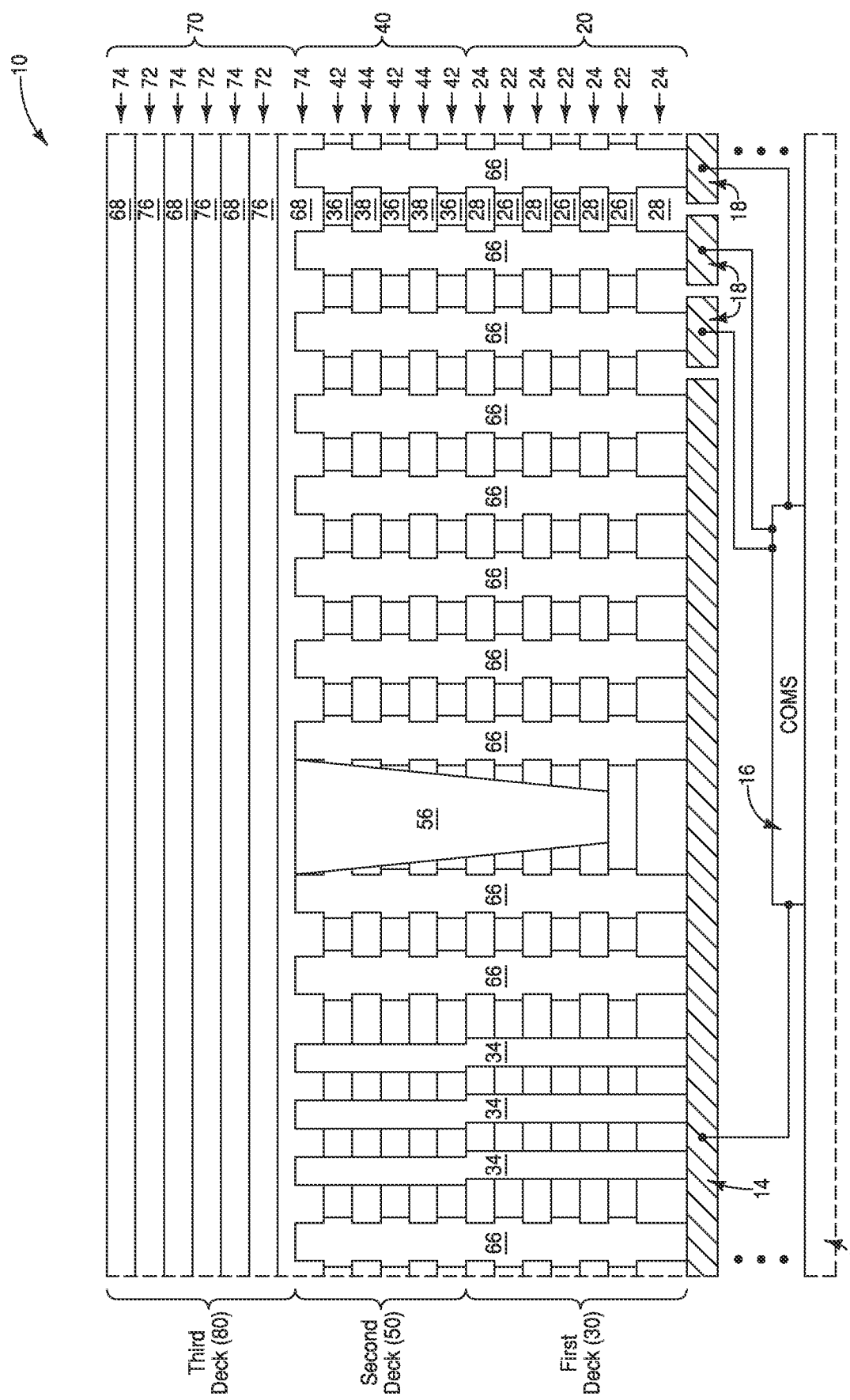

Referring to FIG. 15, a third stack 70 of alternating fifth and sixth tiers (levels, layers) 72 and 74 is formed over the second stack 40. In some embodiments, the insulative material 68 may be considered to be one of the tiers 74 of the third stack 70.

The stack 70 may comprise any suitable number of alternating tiers 72 and 74. The tiers 72 ultimately become conductive levels of a memory arrangement. There may be any suitable number of tiers 72 to form the desired number of conductive levels. In some embodiments, the number of tiers 72 may be 8, 16, 32, 64, etc.

The fifth tiers 72 comprise a fifth material 76. Such fifth material may comprise any suitable composition(s), and in some embodiments may comprise, consist essentially of, or consist of silicon nitride. Accordingly, the fifth material 76 may comprise a same composition as the first and third materials 26 and 36.

The sixth tiers 74 comprise the insulative material 68. In some embodiments, the insulative material 68 may be referred to as an insulative sixth material. The insulative sixth material 68 may comprise a same composition as the insulative second material 28 and the insulative fourth material 38.

The tiers 72 and 74 may have the same thicknesses described above relative to the tiers 22 and 24. In the shown embodiment, the lowermost tier 74 (i.e., the tier formed at the process stage of FIG. 14) is thicker than the other tiers 74 within the stack 70.

The third stack 70 may be considered to be comprised by a third deck 80.

Figure 16:
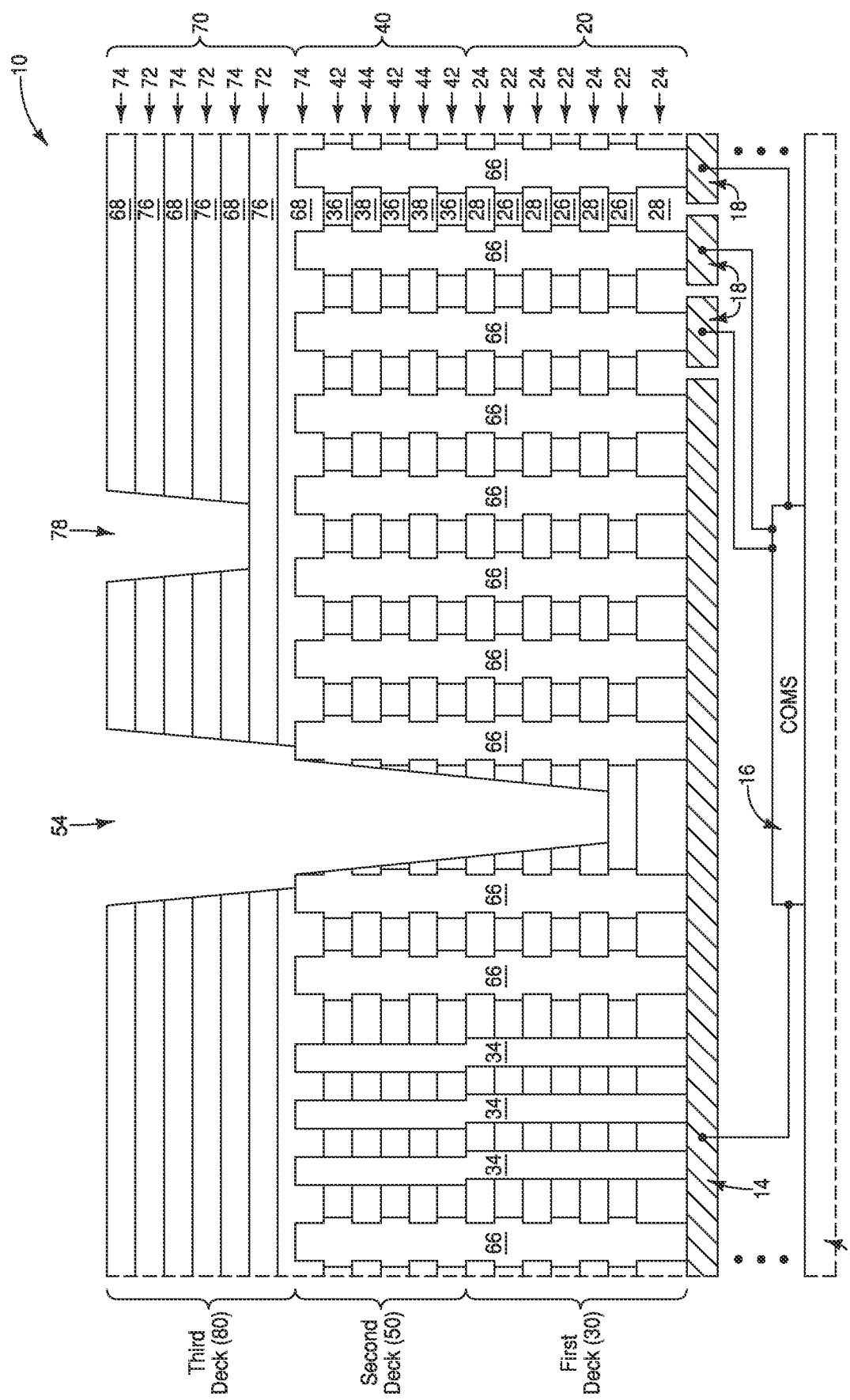

Referring to FIG. 16, a second staircase opening 78 is formed to extend into the third stack 70. In the illustrated embodiment, the second staircase opening extends to the bottommost tier 72 of the third stack.

FIG. 16 also shows the third stack 70 patterned so that the first staircase opening 54 passes through the third stack. In the illustrated embodiment, the sacrificial material 56 (FIG. 15) is removed at the process stage of FIG. 16. In other embodiments, the material 56 may correspond to insulative material (e.g., silicon dioxide), and may remain at the process stage of FIG. 16 rather than being removed.

Figure 17:
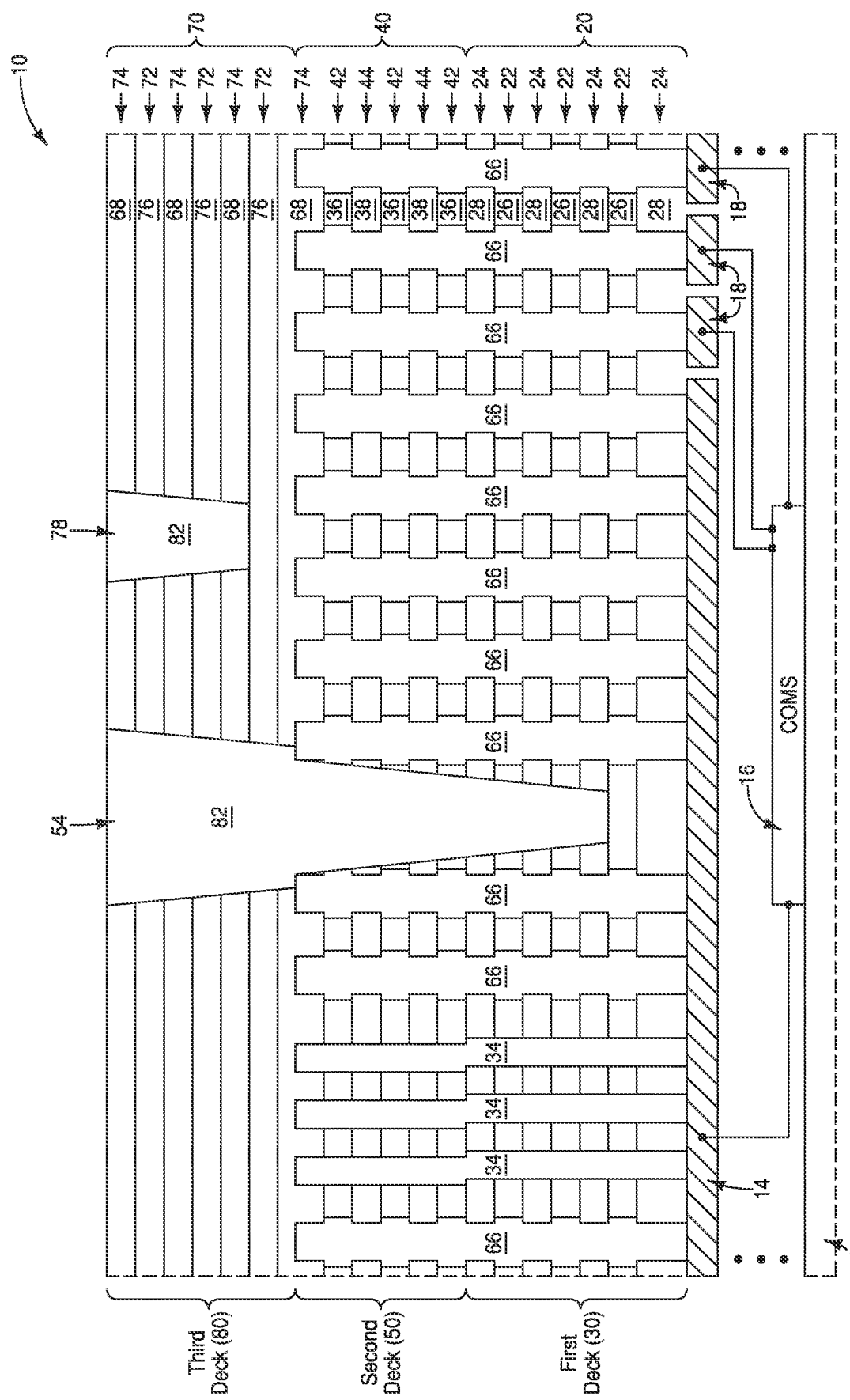

Referring to FIG. 17, insulative material 82 is formed within the staircase openings 54 and 78. The insulative material 82 may comprise any suitable composition(s), and in some embodiments may comprise, consist essentially of, or consist of silicon dioxide. A planarized surface may be formed to extend across the insulative material 82 and the uppermost tier 74.

Figure 18:
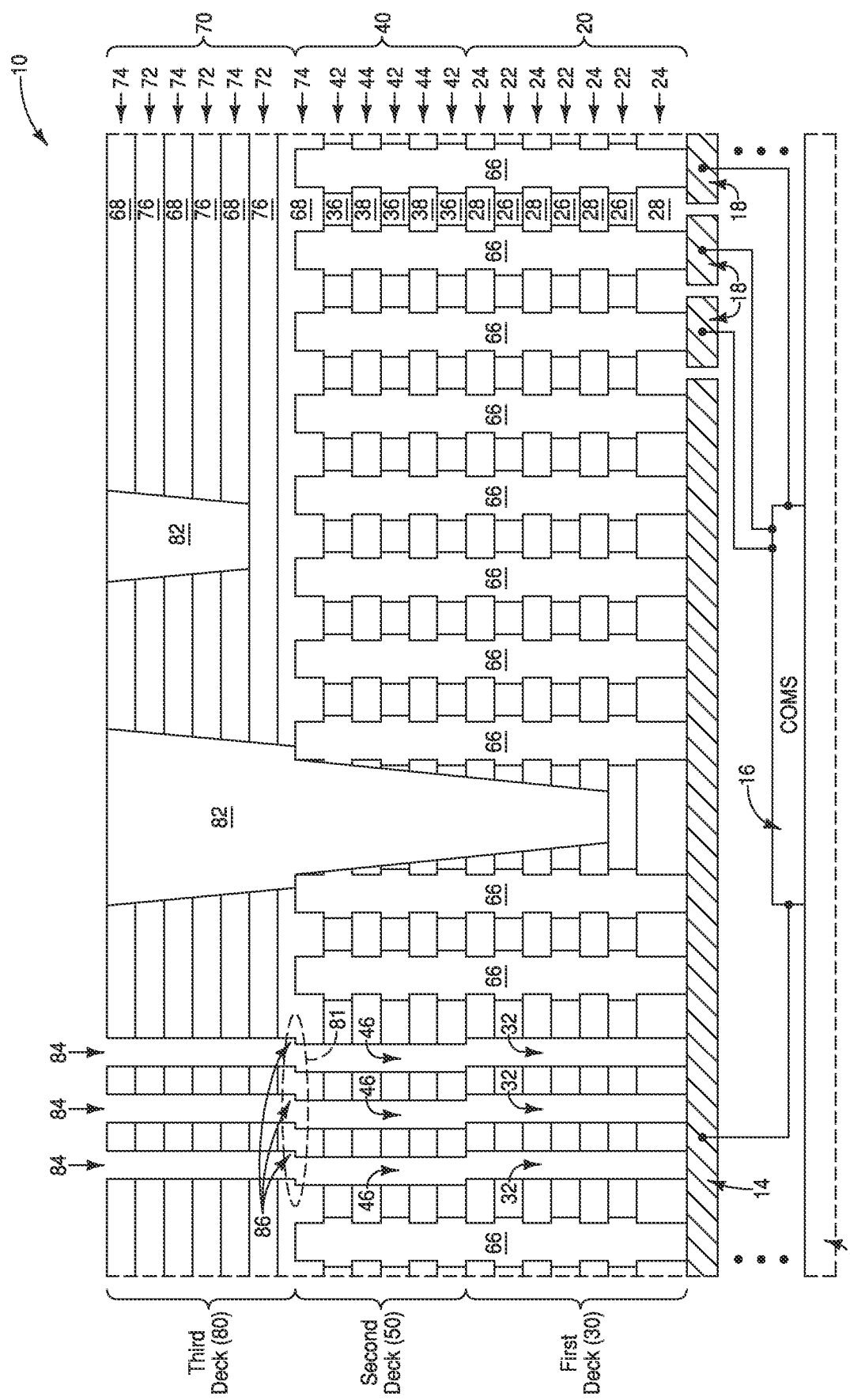

Referring to FIG. 18, third openings 84 are formed through the third stack 70 to the second openings 46, and the sacrificial material 34 (FIG. 17) is removed from within the first and second openings 32 and 46.

The third openings 84 are misaligned relative to the second openings 46 in the illustrated embodiment of FIG. 18. In other embodiments, the third openings 84 may be aligned relative to the second openings 46.

An inter-deck region 81 is a diagrammatically indicated in FIG. 18. The regions wherein the openings 84 join to the openings 46 have inter-deck inflections 86 within the inter-deck region 81. The inter-deck inflections 86 may be analogous to the inter-deck inflections described above with reference to FIG. 10A. In other embodiments the inter-deck inflections 86 may have other configurations, such as, for example, configurations analogous to the configuration described above with reference to FIG. 10B.

Figure 19:
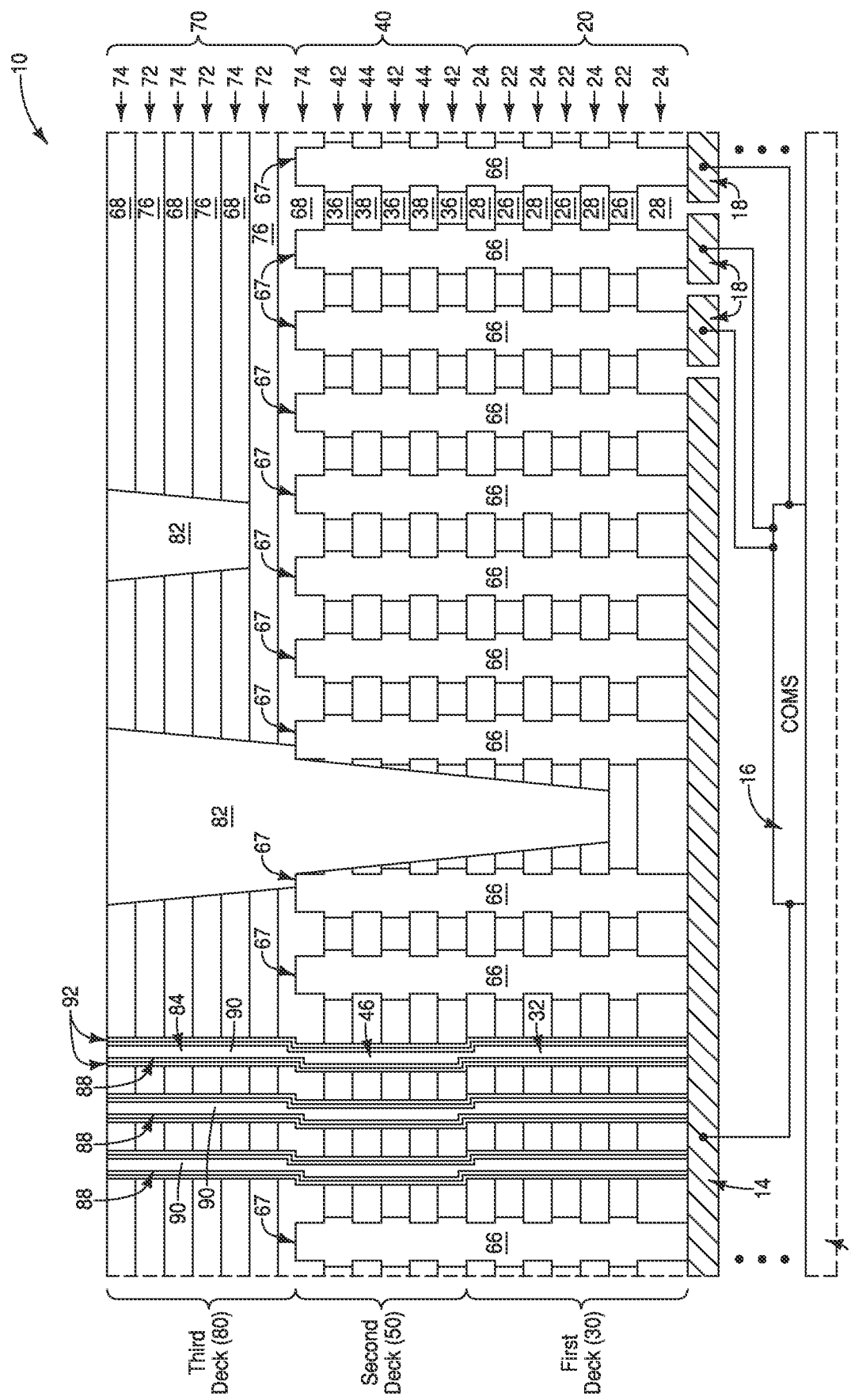

Referring to FIG. 19, channel-material-pillars 88 are formed within the openings 32, 46 and 84. The channel material pillars 88 may be considered to extend vertically through the first, second and third decks 30, 50 and 80, and are shown to be electrically coupled with the conductive structure 14 (and in the shown embodiment are directly against the conductive structure 14). The channel-material-pillars 88 are shown to be hollow, and to laterally surround insulative material 90. The channel material-pillars 88 are offset from edges of the openings 84, 46 and 32 by regions 92 comprising cell materials. The channel-material-pillars 88 and cell materials are shown in more detail relative to enlarged views of FIGS. 19A and 19B.

The channel-material-pillars 88 comprise channel material 94. The channel material 94 may comprise any suitable semiconductor composition(s). In some embodiments, the channel material 94 may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the channel material 94 may comprise silicon. The silicon may be in any suitable crystalline state (e.g., monocrystalline, polycrystalline, amorphous, etc.).

The cell materials within the regions 92 may include gate-dielectric material (insulative material, tunneling material) 96, charge-storage material 98, charge-blocking material 100 and dielectric-barrier material 102. The gate-dielectric material 96 is shown to be adjacent to the channel-material-pillar 98, and in the illustrated embodiment is directly against the channel-material-pillar.

The gate-dielectric material 96 may comprise any suitable composition(s); and in some embodiments may comprise one or more of silicon dioxide, silicon nitride, aluminum oxide, hafnium oxide, zirconium oxide, etc. In some embodiments, the material 96 may comprise a bandgap-engineered laminate.

The charge-storage material 98 may comprise any suitable composition(s), and in some embodiments may comprise charge-trapping material (e.g., one or more of silicon nitride, silicon oxynitride, conductive nanodots, etc.).

The charge-blocking material 100 comprise any suitable composition(s), and some embodiments may comprise one or both of silicon dioxide and silicon oxynitride.

The dielectric-barrier material 102 may comprise any suitable composition(s); and may, for example, comprise one or more high-k compositions (e.g., aluminum oxide, hafnium oxide, zirconium oxide, etc.). The term "high-k composition" means a composition having a dielectric constant greater than the dielectric constant associated with silicon dioxide (i.e., greater than about 3.9).

The insulative material 90 may comprise any suitable composition(s), and in some embodiments may comprise, consist essentially of, or consist of silicon dioxide. In some embodiments, the insulative material 90 may be omitted and the channel-material-pillars 88 may be solid pillars, rather than being the illustrated hollow pillars.

The processing of FIGS. 16-19 shows the staircase openings 54 and 78 patterned in the third deck 80 prior to forming the pillars 88 and the cell materials (i.e., the staircase regions are defined in the third deck prior to forming the pillars 88 to extend through the third deck). In other embodiments, the openings 84 (FIG. 18) may be formed to extend through the third deck, and the pillars 88 and cell materials formed within such openings, prior to patterning the staircase regions within the third deck.

The processing of FIGS. 6-19 comprises formation of the sacrificial material 34 (FIG. 12) within the first and second openings 32 and 46 of the first and second decks 30 and 50 to hold locations for the channel-material-pillars 88, followed by removal of such sacrificial material to form openings which extend through all three of the decks at the process stage of FIG. 18, and then formation of the channel-material-pillars within the openings. In other embodiments, portions of the channel material pillars may be formed at one or more of the process steps prior to the process step of FIG. 19. For instance, first portions (first regions) of the channel-material-pillars may be formed at the process stage of FIG. 7 instead of forming the sacrificial material 34, and second portions (second regions) of the channel-material-pillars may be formed at the process stage of FIG. 10 instead of forming the sacrificial material 34. Alternatively, the sacrificial material 34 may be formed at the process stage of FIG. 7, and then such sacrificial material may be removed at the process stage of FIG. 10 and the first portions (first regions) of the channel-material-pillars may be formed to extend through both of the first and second decks 30 and 50 at the process stage of FIG. 10.

The sacrificial material 66 of FIG. 19 is shown to form structures having upper surfaces 67. Such upper surfaces are formed during the fabrication of the second deck 50, and accordingly may be considered to be associated with the second deck 50 (the second stack 40).

Figure 20:
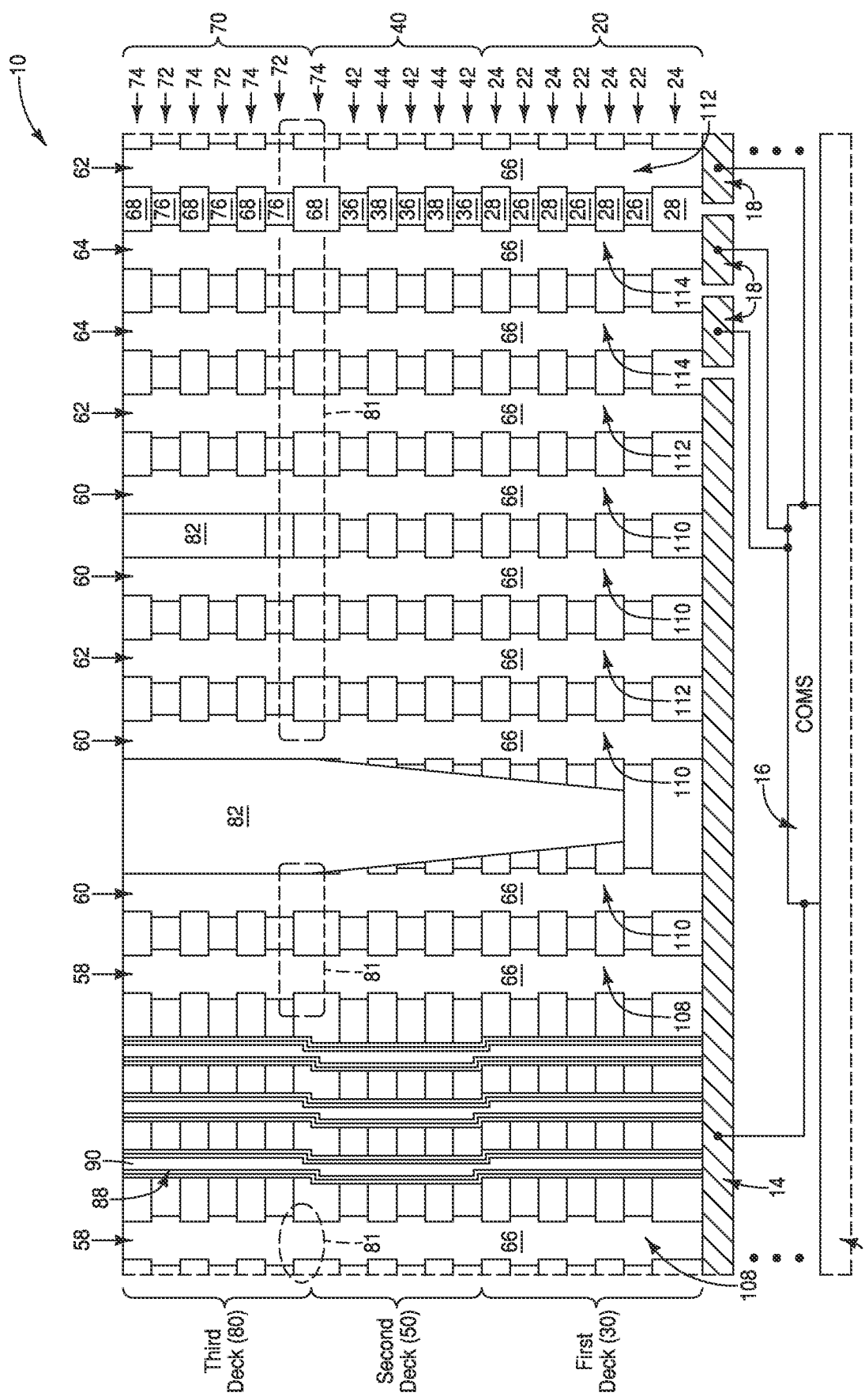
FIG. 20 is a diagrammatic cross-sectional side view of the region of the integrated assembly of FIG. 5 at an example process stage subsequent to that of FIG. 19 of an example method for forming an example memory array.

Referring to FIG. 20, the third stack 70 is patterned to extend the openings 58, 60, 62 and 64 (described above with reference to the process stage of FIG. 13) through the third stack, and then additional sacrificial material 66 is formed within extended openings.

Portions of the inter-deck region 81 are diagrammatically indicated in FIG. 20. The openings 58, 60, 62 and 64 extend through the inter-deck region 81. In the shown embodiment, the portions of the openings 58, 60, 62 and 64 within the third deck 80 are aligned with the portions within the first and second decks 30 and 50 so that inter-deck inflections are not present within the openings 58, 60, 62 and 64. In other embodiments, inter-deck inflections may be present within the openings 58, 60, 62 and 64 along the inter-deck region 81. FIG. 20A shows an enlarged view along one of the openings 58, 60, 62 and 64 at the process stage of FIG. 20, and shows that there is no inter-deck inflection along the inter-deck region 81. FIG. 20B shows a view of the same region in accordance with an embodiment in which the opening within the third deck 80 is not aligned with the opening within the second deck 50, and accordingly in which an inter-deck inflection 104 is formed along the inter-deck region 81. The illustrated inter-deck inflection 104 corresponds to a region where the portion of the opening through the upper deck 80 is laterally offset relative to the portion of the opening within the lower deck 50. In other embodiments the inter-deck inflection may have another configuration, such as, for example, a configuration analogous to the configuration described above with reference to FIG. 10B.

In some embodiments, the sacrificial material 66 within the openings 58, 60, 62 and 64 may be considered to be configured as features 108, 110, 112 and 114. The features 108 may correspond to panels extending in and out of the page relative to the cross-sectional view of FIG. 20, and the features 110, 112 and 114 may correspond to pillars. Each of the features has a first portion which extends through the first and second stacks 20 and 40, and which is formed after forming the second stack (with such first portions being shown at the process stage of FIG. 19, and having the upper surfaces 67); and each of the features has a second portion which extends through the third stack 70 and which is formed directly against the first portion (with the second portions being shown in FIG. 20). Example first and second portions are shown in FIGS. 20A and 20B as portions 116 and 118, respectively. The portions 116 and 118 join to one another along the inter-deck region 81. In the embodiment of FIG. 20A there is no inter-deck inflection where the portions 116 and 118 join to one another. In contrast, FIG. 20B shows an inter-deck inflection where the portion 116 joins to the portion 118.

Figure 21:
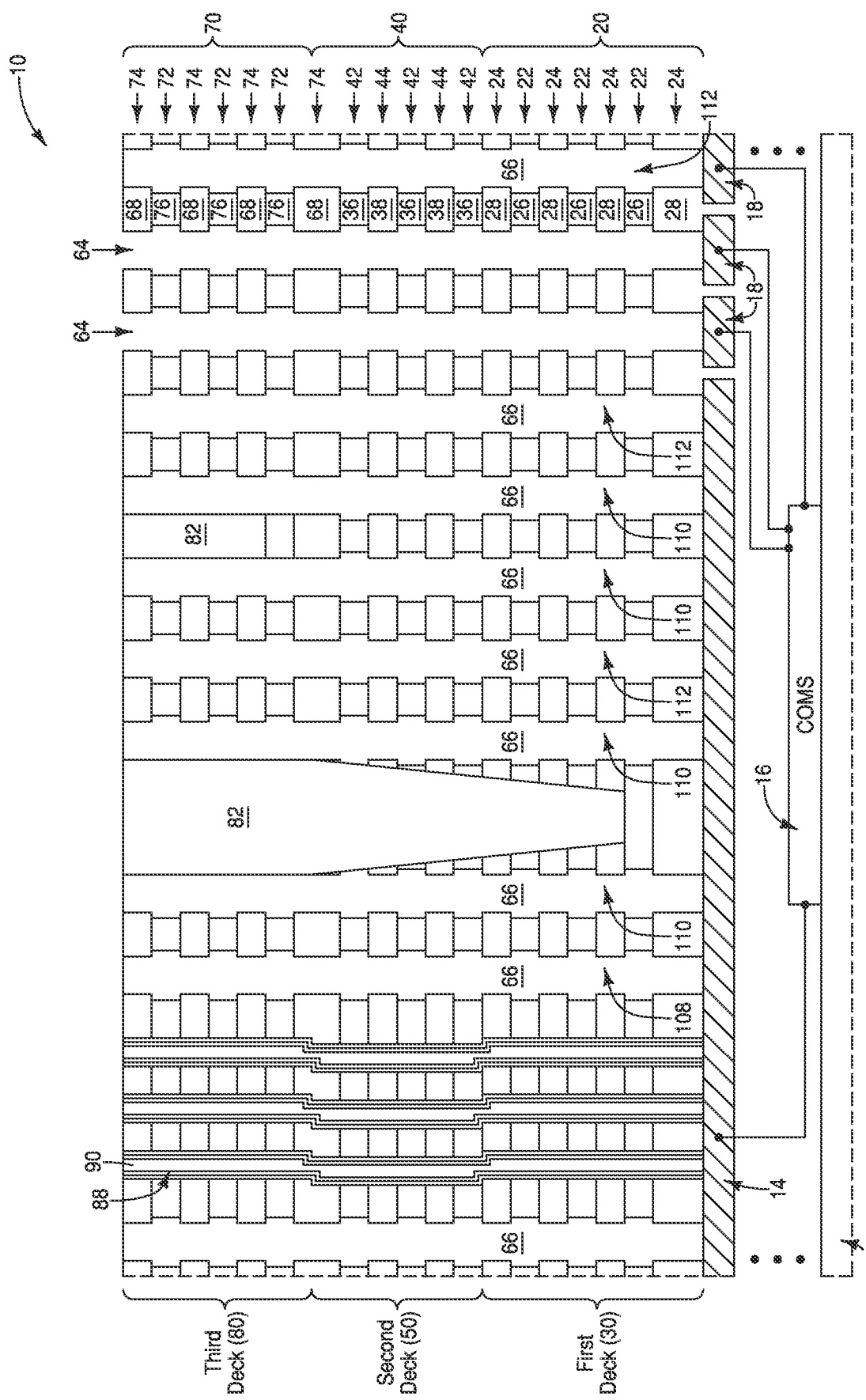
FIGS. 21-26 are diagrammatic cross-sectional side views of the region of the integrated assembly of FIG. 5 at example sequential process stages of an example method for forming an example memory array. The process stage of FIG. 21 may follow that of FIG. 20.

Referring to FIG. 21, the features 114 (FIG. 20) within the openings 64 are removed. Remaining portions of the assembly 10 may be protected with a mask (not shown) while the sacrificial material 66 of the features 114 is removed.

Figure 22:
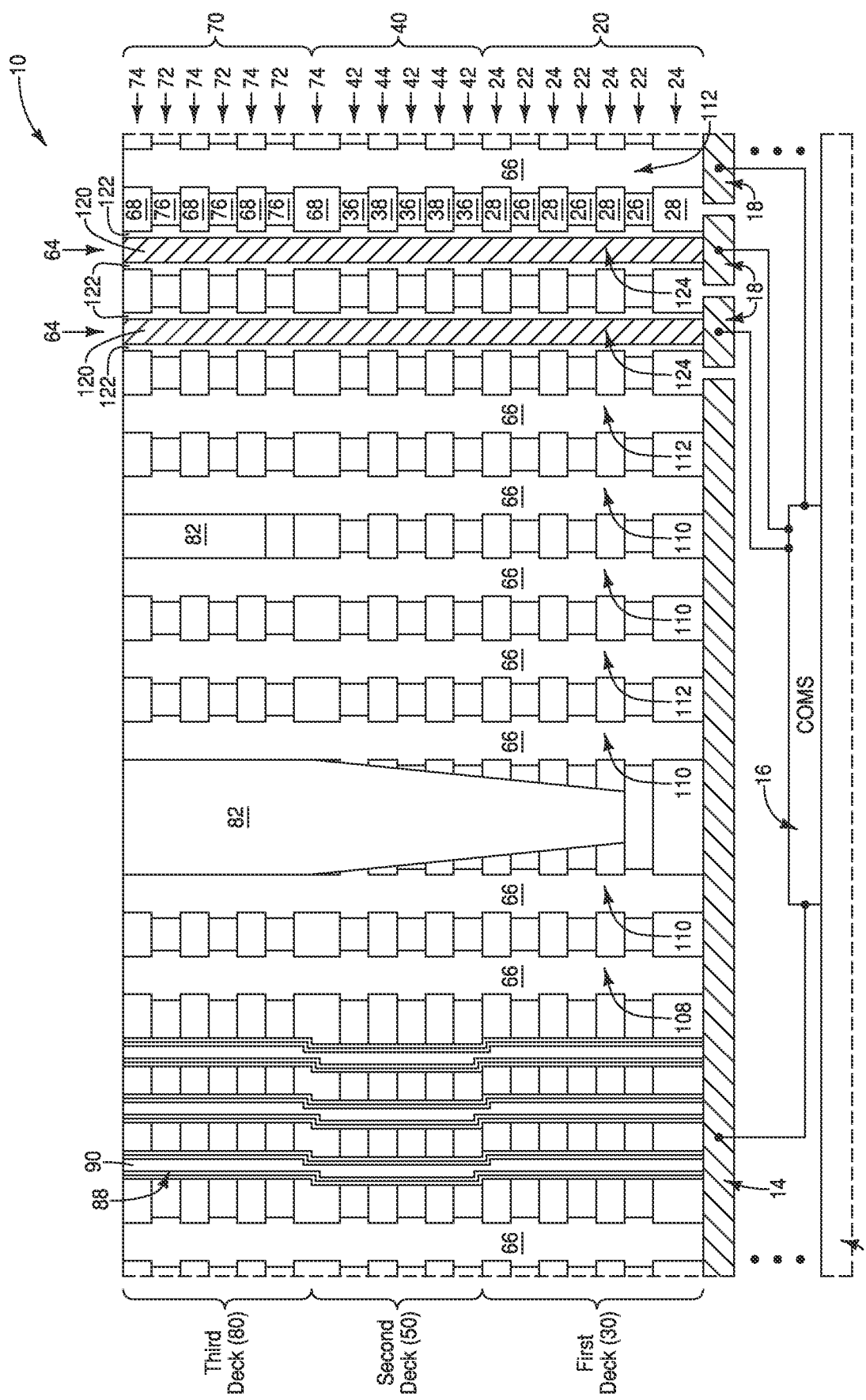

Referring to FIG. 22, the openings 64 are lined with insulative material 122, and then conductive material 120 is formed within the lined openings. The insulative material 122 may comprise any suitable composition(s), and in some embodiments may comprise silicon dioxide. The conductive material 120 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

In some embodiments, the processing of FIGS. 21 and 22 may be considered to replace at least some of the sacrificial material 66 of the features 114 (FIG. 20) with the conductive material 120.

The conductive material 120 within the openings 64 is configured as conductive interconnects 124 which extend through the decks 30, 50 and 80, and to a pair of the conductive structures 18. The conductive interconnects 124 may be "live" interconnects utilized for coupling circuitry to the CMOS 16 through the conductive structures 18. In the illustrated embodiment, one of the sacrificial structures 112 remains over one of the conductive structures 18. The conductive structure 18 under the sacrificial structure 112 may or may not be coupled with the CMOS 16. In some embodiments (not shown) a conductive structure analogous to the structure 124 may be formed over a conductive structure 18 and may not be electrically coupled to the CMOS 16. Instead such conductive structure 124 may be used solely as a support structure (a "dummy" structure) rather than as a "live" structure.

Figure 23:
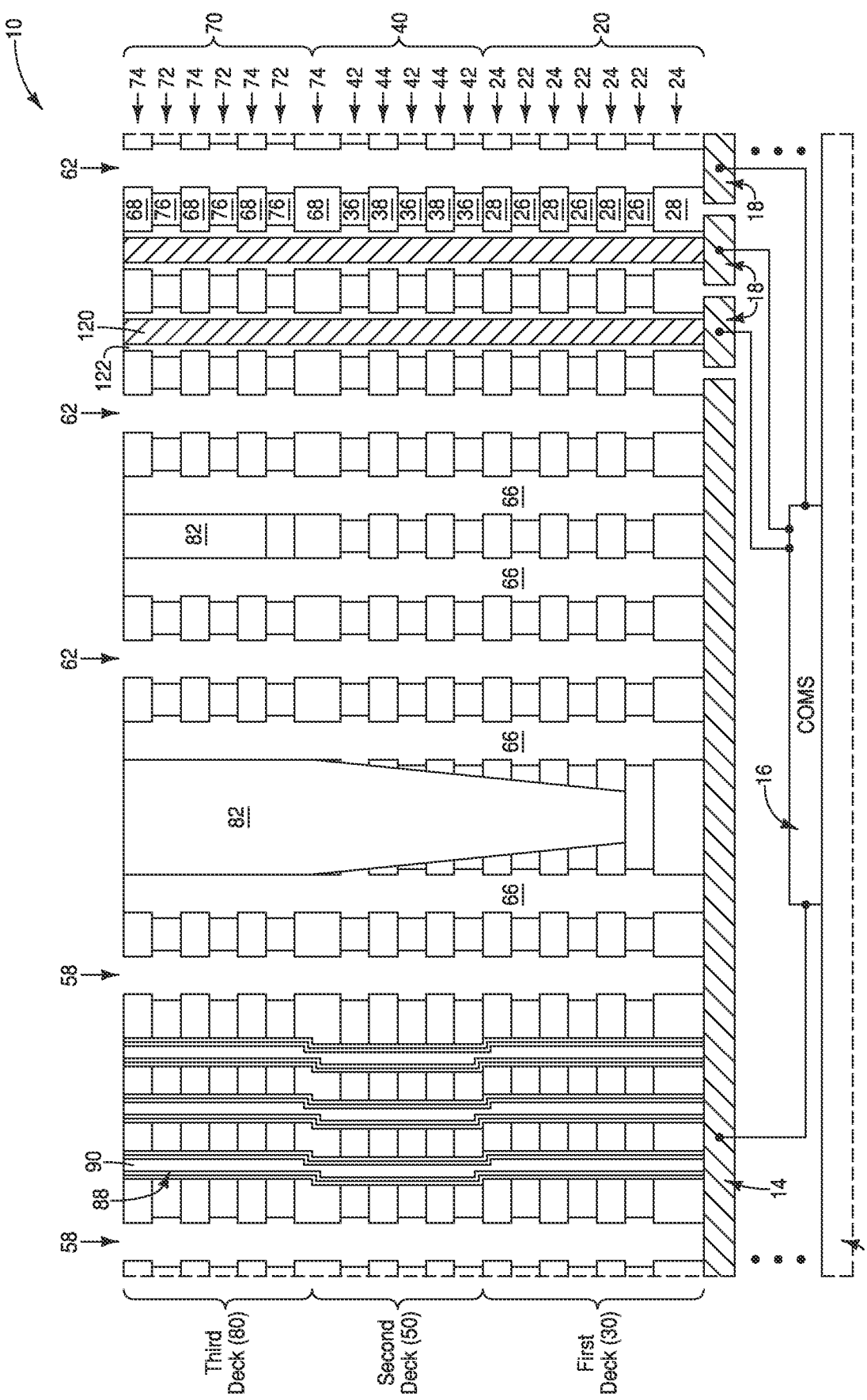

Referring to FIG. 23, the sacrificial material 66 is removed from within the openings 58 and 62.

Figure 24:
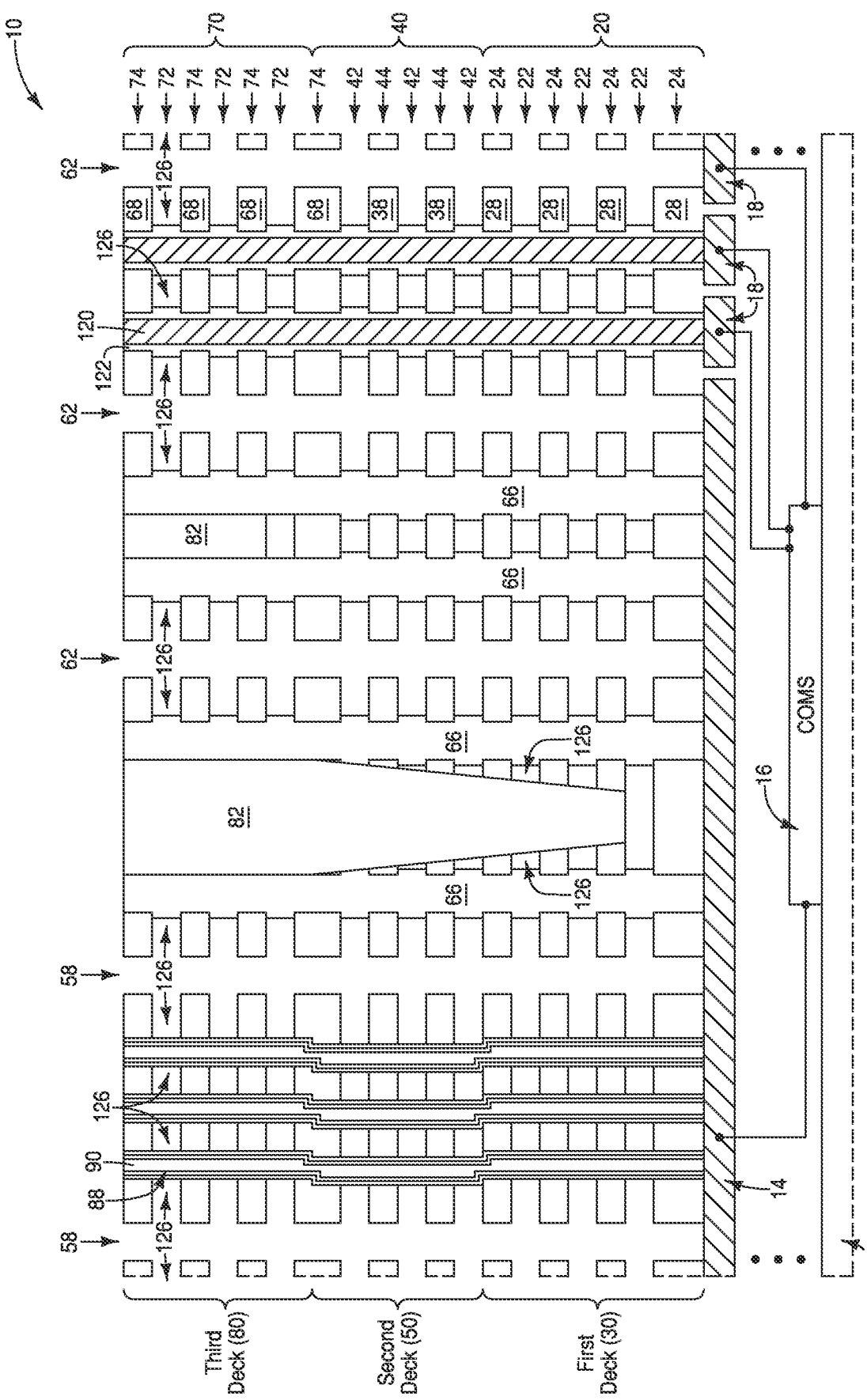

Referring to FIG. 24, etchant (not shown) is flowed into the openings 58 and 62, and is utilized to remove the materials 26, 36 and 76 (shown in FIG. 23) to form voids 126 along the levels 22, 42 and 72.

Figure 25:
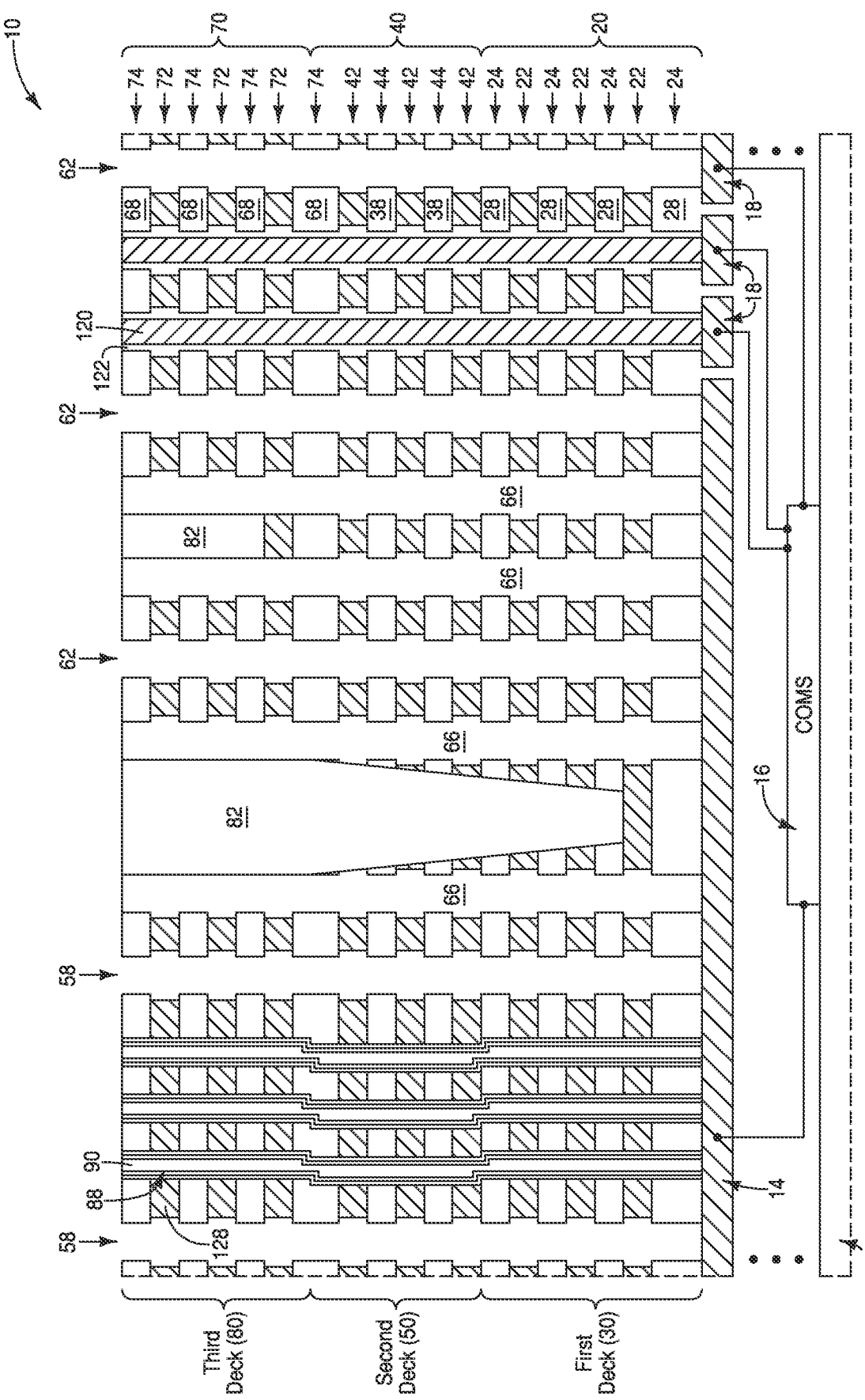

Referring to FIG. 25, conductive material 128 is formed within the voids 126 (FIG. 24). The conductive material 128 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.), and may comprise a metal-containing composition (e.g., metal nitride, metal carbide, metal silicide, etc.). In some embodiments, the conductive material 128 may comprise a metal-containing core (e.g., a tungsten-containing core), and a metal nitride (e.g., titanium nitride, tungsten nitride, etc.) along a periphery of the metal-containing core. In some embodiments, dielectric-barrier material may be formed within the voids 126 (FIG. 24) prior to forming the conductive material 128 within the voids. In such embodiments, the dielectric-barrier material 102 (FIGS. 19A and 19B) may not be formed within the openings 32, 46 and 84 of FIG. 18.

The alternating levels 22 and 24 of the first stack 20 may be referred to as first conductive levels and first insulative levels, respectively; the alternating levels 42 and 44 of the second stack 40 may be referred to as second conductive levels and second insulative levels, respectively; and the alternating levels 72 and 74 of the third stack 70 may be referred to as third conductive levels and third insulative levels, respectively.

The processing of FIGS. 24 and 25 may be considered to replace at least some of the first, third and fifth materials 26, 36 and 76 (FIG. 23) with one or more conductive materials (e.g., the conductive material 128) to form the first, second and third conductive levels 22, 42 and 72 of FIG. 25.

Figure 26:
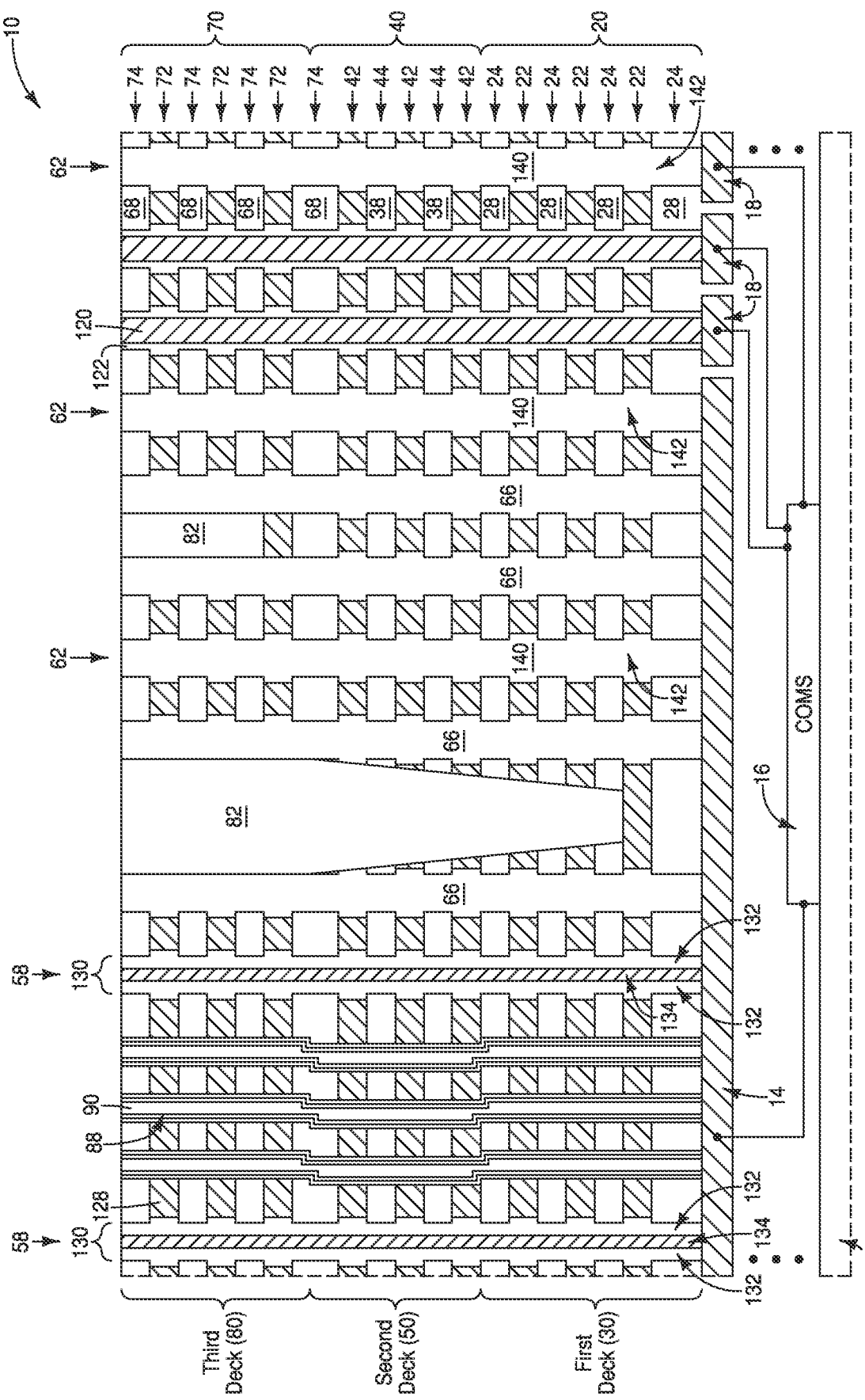

Referring to FIG. 26, panels 130 are formed within the slits corresponding to the openings 58. In the shown embodiment, the panels 130 comprise insulative edge structures 132, and conductive central structures 134. The insulative structures 132 may comprise any suitable composition(s); and in some embodiments may comprise, consist essentially of, or consist of silicon dioxide. The central structures 134 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the central structures 134 may comprise, consist essentially of, or consist of appropriately-doped silicon.

Insulative material 140 is formed within the openings 62. The insulative material 140 may comprise any suitable composition(s), and in some embodiments may comprise, consist essentially of, or consist of silicon dioxide.

In some embodiments, panels 130 may be considered to replace the sacrificial features 108 (FIG. 22), and the insulative material 140 may be considered to form insulative features 142 which replace the sacrificial features 112 (FIG. 22). One of the insulative features 142 is over one of the conductive structures 18. Such conductive structure may or may not be coupled with the CMOS 16.

Figure 26A:
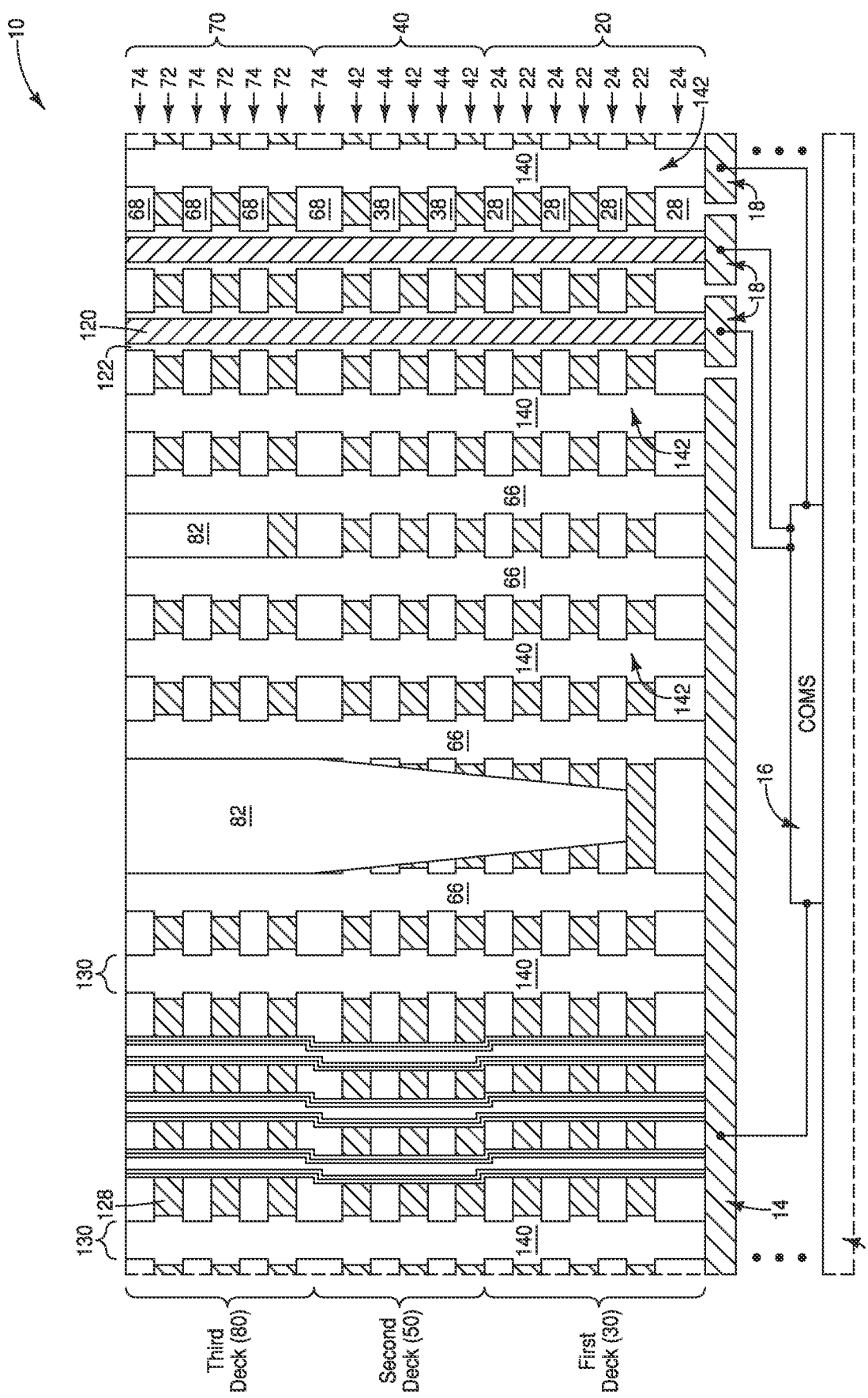
FIG. 26A is a diagrammatic cross-sectional side view of a region similar to that of FIG. 26 in accordance with another example embodiment.

FIG. 26A shows an alternative embodiment relative to that of FIG. 26. Specifically, the panels 130 comprise only insulative material, rather than also comprising the conductive central regions 134. In the illustrated embodiment, the panels 130 comprise the same insulative material 140 as is utilized in the insulative structures 142.

Figure 27:
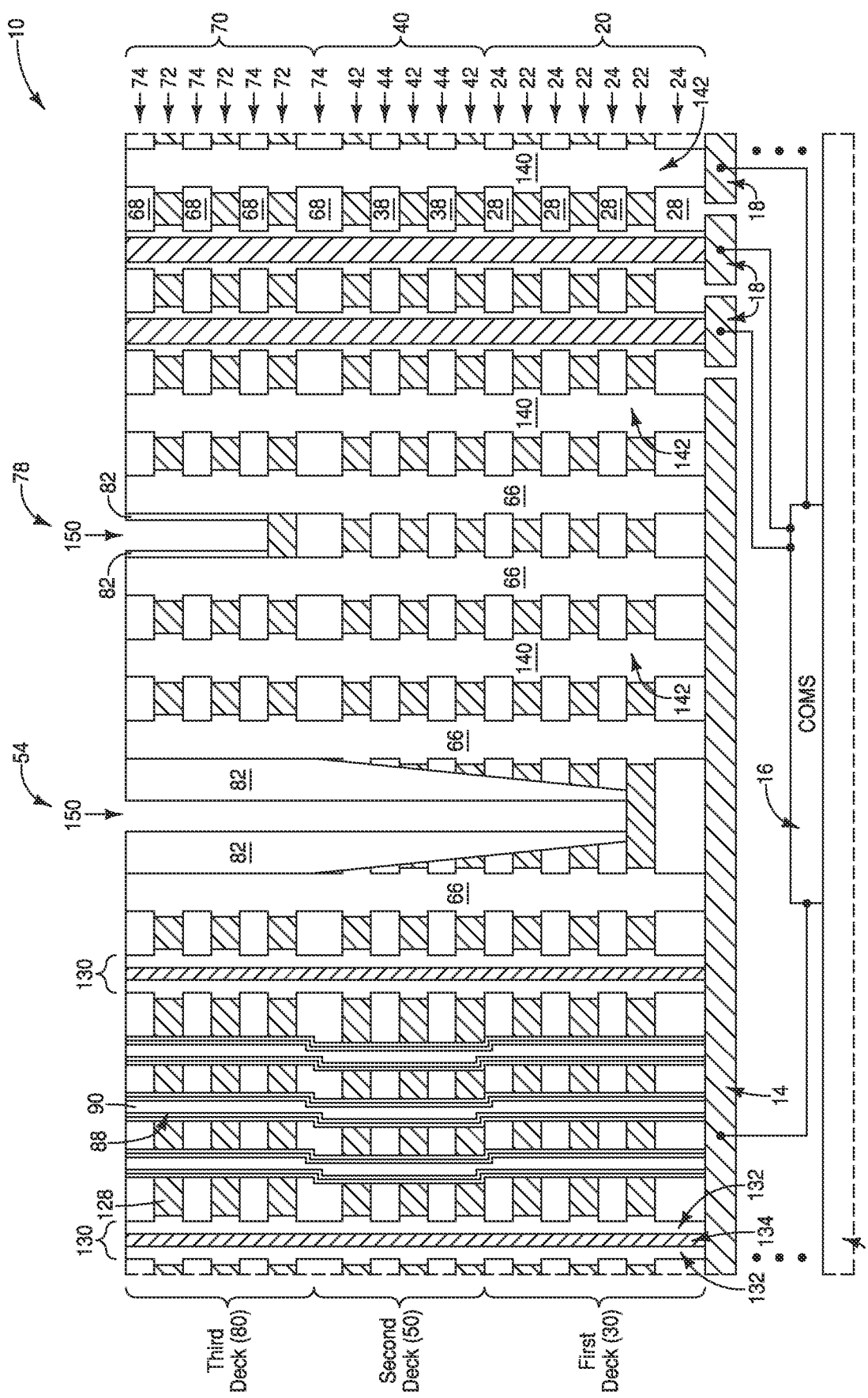
FIGS. 27 and 28 are diagrammatic cross-sectional side views of the region of the integrated assembly of FIG. 5 at example sequential process stages of an example method for forming an example memory array. The process stage of FIG. 27 may follow that of FIG. 26.

FIG. 27 shows the assembly 10 at a process stage subsequent to that of FIG. 26. Openings 150 are formed to extend into the first and second staircase regions 54 and 78. An insulative material (not shown) may be formed over an upper surface of the assembly 10 prior to forming the openings 150.

Figure 28:
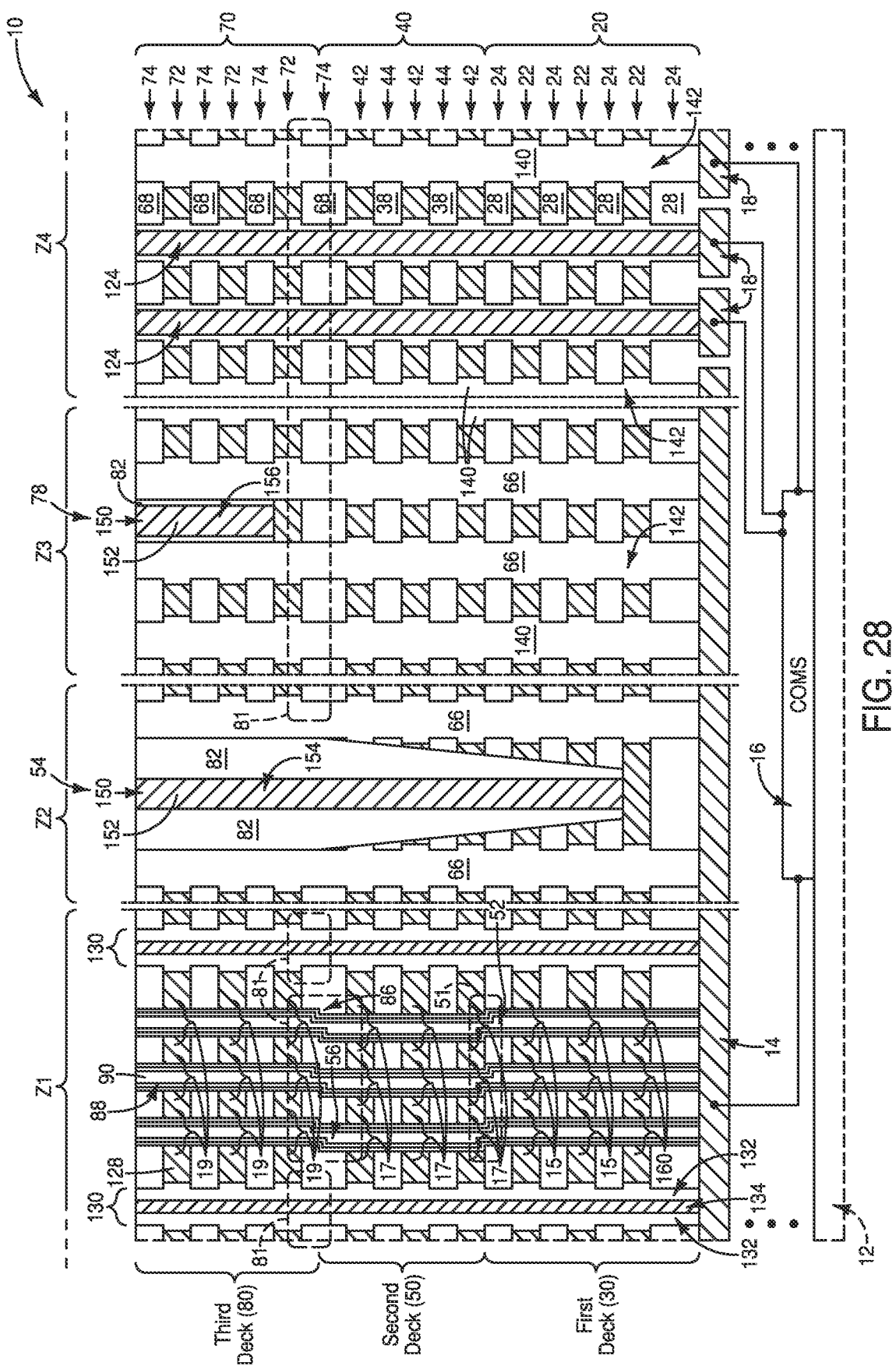

Referring to FIG. 28, conductive material 152 is formed within the openings 150. The conductive material 152 forms a first interconnect 154 in the first staircase region 54, with such first interconnect extending to one of the conductive levels within the stacks 20 and 40. In the illustrated embodiment, the interconnect 154 extends to the bottommost conductive level. Other interconnects (described below with reference to FIG. 29) may be formed to extend to other levels within the stacks 20 and 40.

The conductive material 152 forms a second interconnect 156 within the second staircase region 78, with such second interconnect extending to one of the conductive levels within the third stack 70. In the shown embodiment, the interconnect 156 extends to the bottommost conductive level of the stack 70. Other interconnects (described below with reference to FIG. 29) may be formed to extend to other levels within the stack 70.

The inter-deck regions 51 and 81 are diagrammatically illustrated in FIG. 28. Such regions may be considered to be boundaries between adjacent decks, with the region 51 being a boundary between the first and second decks 30 and 50, and the region 81 being a boundary between the second and third decks 50 and 80.

The channel-material-pillars 88 may be considered to correspond to first features which pass through the first, second and third decks. Each of such first features has two inter-deck inflections, as described above with reference to FIGS. 10 and 18. One of the inter-deck inflections is an inflection 52 in the first inter-deck region 51, and the other is an inflection 86 in the inter-deck region 81.

One or more of the panels 130, insulative structures 142 and conductive interconnects 124 may be considered to be a second feature passing through the first, second and third decks. The second feature has no inter-deck inflection associated with the first inter-deck region 51, and may or may not have an inter-deck inflection associated with the second region 81 (as described above with reference to FIGS. 20, 20A and 20B).

First memory cells 15 are along the first conductive levels 22, second memory cells 17 are along the second conductive levels 42, and third memory cells 19 are along the third conductive levels 72. Each of the first, second and third memory cells includes a portion of a channel-material-pillar 88, portions of the memory cell materials adjacent the channel-material-pillar (with the memory cell materials been described above with reference to FIGS. 19A and 19B), and portions of the conductive levels. The memory cells 15, 17 and 19 along the pillars 88 may correspond to vertical strings of memory cells suitable for utilization in NAND memory of the types described above with reference to FIGS. 1-4.

The bottom conductive level 22 of the first deck 20 are shown to comprise source-side select gate (SGS) devices 160 rather than comprising memory cells. In some embodiments, more than one conductive level may be incorporated into the SGS devices. If multiple conductive levels are incorporated into the SGS devices, the conductive levels may be electrically ganged together.

The first memory cells 15 may be considered to be arranged in first tiers (the levels 22), with such first tiers being disposed one atop another and being comprised by the first deck 30. The second memory cells 17 may be considered to be arranged in second tiers (the levels 42), with such second tiers being disposed one atop another and being comprised by the second deck 50. The third memory cells 19 may be considered to be arranged in third tiers (the levels 72) with such third tiers being disposed one atop another and being comprised by the third deck 80.

The various features within the view of FIG. 28 may be within multiple planes of an assembly. The various planes are separated from one another, and are indicated to be within regions designated as Z1, Z2, Z3 and Z4.

Figure 28A:
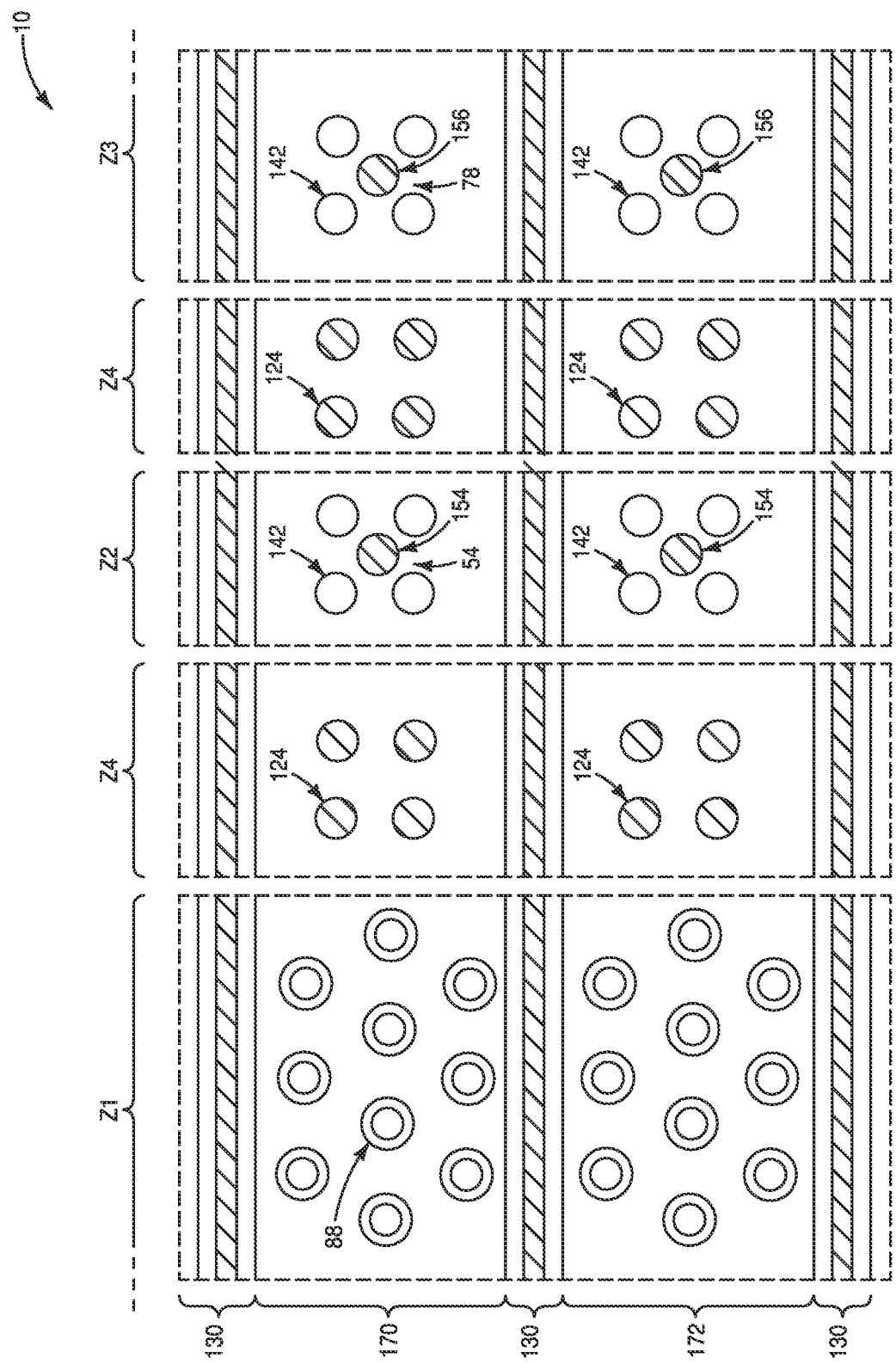
FIG. 28A is a diagrammatic top-down view of a region of the assembly of FIG. 28.

FIG. 28A shows a top-down view of the assembly 10 diagrammatically illustrating an example arrangement of the various structures shown in FIG. 28. The channel-material-pillars 88 may be considered to be arranged in a memory block 170 analogous to the block regions described above with reference to FIGS. 1-4. The panels 130 may correspond to structures which separate one block region from another. For instance, a second block region 172 may be on opposing side of one the panels 130 from the first block region 170. In some embodiments, each of the channel-material-pillars 88 may be substantially identical to the others (with the term "substantially identical" meaning identical to within reasonable tolerances of fabrication and measurement). The panels 130 may include a first panel 130 along a first lateral edge of the memory block 170, and a second panel 130 along a second lateral edge of the memory block (with said second lateral edge of the memory block being in opposing relation to said first lateral edge of the memory block).

The view of FIG. 28A shows an example configuration of the various features. Other configurations may be utilized in other embodiments.

The interconnects 124 of FIGS. 28 and 28A may couple circuitry above the memory cells (15, 17, 19) with the CMOS circuitry 16. For instance, the interconnects 124 may be coupled with drain-side select gate (SGD) circuitry, bitline circuitry, etc. Alternatively, or additionally, the interconnects 124 may extend to circuitry which is laterally outward of the illustrated region of the assembly 10.

Figure 29:
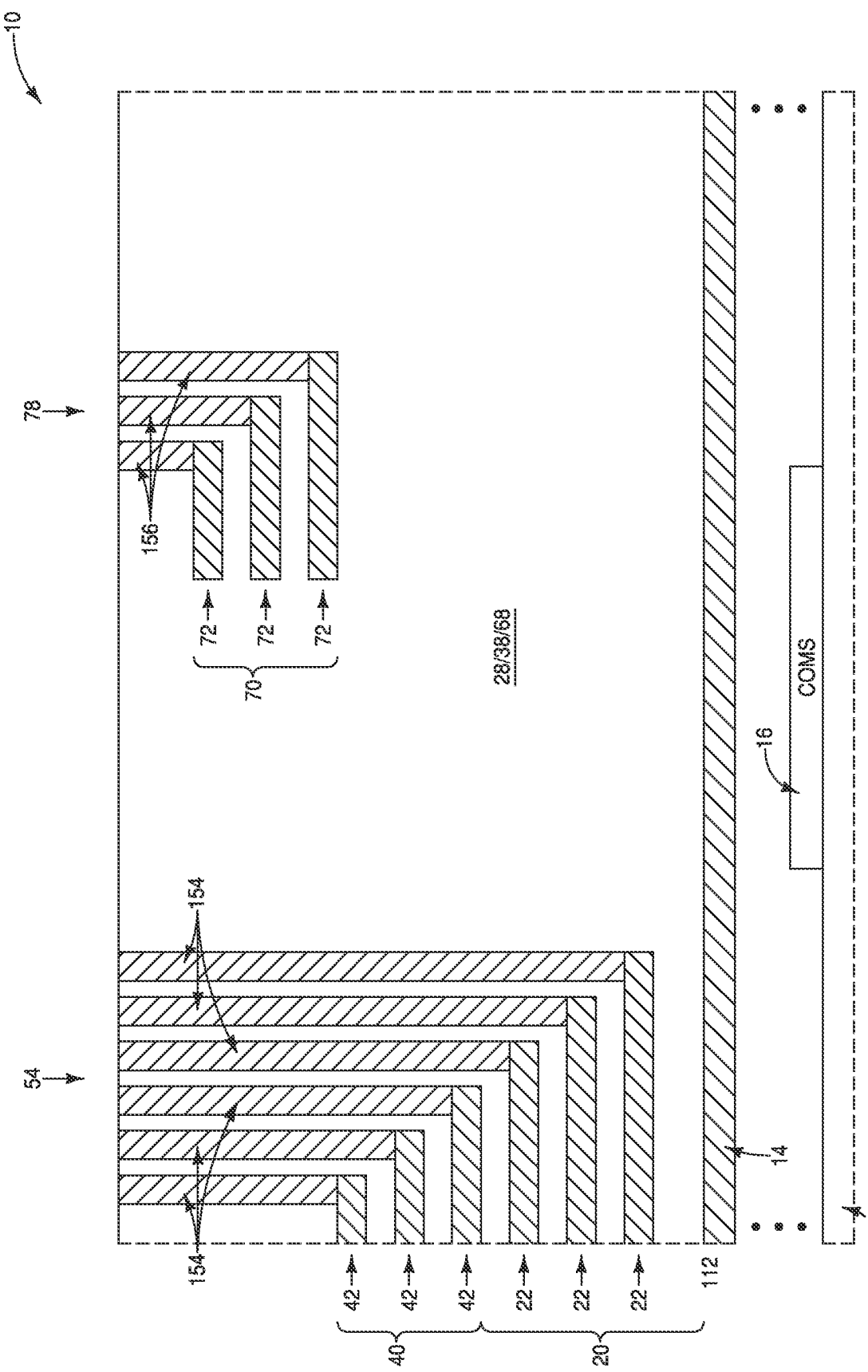
FIG. 29 is a diagrammatic cross-sectional side view of another region of an integrated assembly showing example staircase regions.

The staircase regions 54 and 78 of FIGS. 28 and 28A may be utilized for connecting to multiple tiers within the stacks 20, 40 and 70. FIG. 29 diagrammatically illustrates portions of the staircase regions 54 and 78 in an alternative view relative to that of FIG. 28. The interconnects 154 within the staircase region 54 extend to multiple conductive levels 22 and 42 within the stacks 20 and 40. The interconnects 156 within the staircase region 78 extend to multiple conductive levels 72 within the stack 70. The insulative material of FIG. 29 is labeled as 28/38/68 to indicate that such insulative material may comprise one or more of the materials 28, 38 and 68.

The embodiments described herein advantageously enable staircase regions to be efficiently formed relative to the multiple stacked levels of the illustrated decks. It may be problematic to form three separate staircase regions to reach the conductive levels of each of the illustrated three stacked decks as such may be inefficient relative to the number of patterning steps (and accordingly may have unnecessary costs), and may utilize a substantial amount of semiconductor real estate. Alternatively, it may be problematic to utilize only a single staircase region to reach the multiple levels of all three of the illustrated three stacked decks in that the lowermost levels are too deep to reach efficiently with conventional etch processes. Embodiments described herein advantageously utilize a first staircase region to reach the stacks associated with two of the decks, and utilize a second staircase region to reach the stack associated the third of the decks. Accordingly, such embodiments avoid the problems associated with utilizing separate staircase regions for each deck (i.e., three separate staircase regions), and avoid the problems associated with utilizing only a single staircase region for all of the decks.

In some aspects, embodiments described herein may be detected in final structures due to asymmetry present between the vertical configuration of the channel-material-pillars (88) and the vertical configuration of other features besides the channel-material-pillars, with examples of such other features being the panels 130, the support structures 142, and the interconnects ("live" structures) 124.

Although the embodiments described herein show three stacked decks, it is to be understood that in other applications such embodiments may be extended to configurations having more than three stacked decks.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a first deck with first memory cells arranged in first tiers disposed one atop another, a second deck over the first deck, and a third deck over the second deck. The second deck has second memory cells arranged in second tiers disposed one atop another, and the third deck has third memory cells arranged in third tiers disposed one atop another. A first feature passes through the first, second and third decks. The first feature has two inter-deck inflections, with one of said two inter-deck inflections of the first feature being associated with a boundary between the first and second decks, and with the other of said two inter-deck inflections of the first feature being associated with a boundary between the second and third decks. A second feature passes through the first, second and third decks. The second feature has no inter-deck inflection associated with the boundary between the first and second decks.

Some embodiments include an integrated assembly having a first deck, a second deck over the first deck, and a third deck over the second deck. The first deck has first conductive levels disposed one atop another. The second deck has second conductive levels disposed one atop another. The third deck has third conductive levels disposed one atop another. A first staircase region extends to the first and second conductive levels, and passes through the third conductive levels. A second staircase region extends to the third conductive levels and not to the first and second conductive levels.

Some embodiments include a method of forming an integrated assembly. A first stack of alternating first and second tiers is formed over a conductive structure. The first and second tiers comprise a first material and an insulative second material, respectively. A first opening is formed to extend through the first stack. A second stack of alternating third and fourth tiers is formed over the first stack. The third and fourth tiers comprise a third material and an insulative fourth material, respectively. A second opening is formed to extend through the second stack to the first opening. A first staircase opening is formed to extend into the first and second stacks. A third stack of alternating fifth and sixth tiers is formed over the second stack. The fifth and sixth tiers comprise a fifth material and an insulative sixth material, respectively. A third opening is formed to extend through the third stack to the second opening. A region of the third stack is patterned to pass the first staircase opening through the third stack. A second staircase opening is formed to extend into the third stack. A channel-material-pillar is formed within the first, second and third openings. The channel-material-pillar extends vertically through the first, second and third stacks and is electrically coupled with the conductive structure. At least some of the first, third and fifth materials is replaced with one or more conductive materials to thereby convert the first, third and fifth tiers to first, second and third conductive levels, respectively. A first interconnect is formed to extend to one of the first and second conductive levels through the first staircase opening. A second interconnect is formed to extend to one of the third conductive levels through the second staircase opening.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
    a first deck having first conductive levels disposed one atop another;
    first memory cells along the first conductive levels and including regions of a channel-material-pillar;
    a second deck over the first deck; the second deck having second conductive levels disposed one atop another;
    second memory cells along the second conductive levels and including regions of the channel-material-pillar;
    a third deck over the second deck; the third deck having third conductive levels disposed one atop another;
    third memory cells along the third conductive levels and including regions of the channel-material-pillar;
    a source structure under the first deck;
    the channel-material-pillar extending through the first, second and third decks to the source structure, wherein the channel-material-pillar has a first inter-deck inflection associated with a boundary between the first and second decks, and has a second inter-deck inflection associated with a boundary between the second and third decks;
    a first staircase region extending to the first and second conductive levels, and passing through the third conductive levels; and
    a second staircase region extending to the third conductive levels and not to the first and second conductive levels.

2. The integrated assembly of claim 1 comprising:
    a base that supports the source structure under the first deck.

3. The integrated assembly of claim 1, wherein the first inter-deck inflection includes a detectable change in a region of a structure passing through an interface between the first and second decks.

4. The integrated assembly of claim 1 wherein the second inter-deck inflection includes a detectable change in a region of a structure passing through an interface between the second and third decks.

5. The integrated assembly of claim 1 comprising panels extending through the first, second and third decks; and wherein the panels have no inter-deck inflection associated with the boundary between the first and second decks.

6. The integrated assembly of claim 5 wherein the channel-material-pillar is one of many substantially identical channel-material-pillars within a memory block; and wherein the panels include a first panel along a first lateral edge of the memory block, and include a second panel along a second lateral edge of the memory block, with the second lateral edge being in opposing relation to the first lateral edge.

7. The integrated assembly of claim 1 comprising structural-support-pillars extending through the first, second and third decks; and wherein the structural-support-pillars have no inter-deck inflection associated with the boundary between the first and second decks.

8. The integrated assembly of claim 1 comprising:
    conductive structures laterally adjacent to the source structure; and
    conductive interconnects extending through the first, second and third decks and being electrically coupled with the conductive structures; the conductive interconnects having no inter-deck inflection associated with the boundary between the first and second decks.

9. The integrated assembly of claim 1 wherein at least one of the first conductive levels is a source-side select gate (SGS) level.

10. A method of forming an integrated assembly, comprising: an integrated assembly, comprising:
    forming a first stack of alternating first and second tiers over a conductive structure; the first and second tiers comprising a first material and an insulative second material, respectively;
    forming a first opening to extend through the first stack;
    forming a second stack of alternating third and fourth tiers over the first stack; the third and fourth tiers comprising a third material and an insulative fourth material, respectively;
    forming a second opening to extend through the second stack to the first opening;
    forming a first staircase opening to extend into the first and second stacks;
    forming a third stack of alternating fifth and sixth tiers over the second stack; the fifth and sixth tiers comprising a fifth material and an insulative sixth material, respectively;
    forming a third opening to extend through the third stack to the second opening;
    patterning a region of the third stack to pass the first staircase opening through the third stack;
    forming a second staircase opening to extend into the third stack;
    forming a channel-material-pillar within the first, second and third openings; the channel-material-pillar extending vertically through the first, second and third stacks and being electrically coupled with the conductive structure;

replacing at least some of the first, third and fifth materials with one or more conductive materials to thereby convert the first, third and fifth tiers to first, second and third conductive levels, respectively;

forming a first interconnect extending to one of the first and second conductive levels through the first staircase opening; and forming a second interconnect extending to one of the third conductive levels through the second staircase opening.

11. The method of claim 10 wherein the conductive structure is a source structure.

12. The method of claim 10 further comprising forming cell materials within the first, second and third openings, and forming the channel-material-pillar adjacent to the cell materials; the cell materials including charge-blocking material, charge-storage material and gate-dielectric material.

13. The method of claim 10 further comprising forming sacrificial material within the first opening prior to forming the second stack.

14. The method of claim 10 further comprising forming sacrificial material within the first and second openings prior to forming the third stack.

15. The method of claim 14 further comprising:
removing the sacrificial material from within the first and second openings after forming the third opening; and
after removing the sacrificial material, forming the channel-material-pillar within the first, second and third openings.

16. The method of claim 10 further comprising:
forming a first region of the channel-material-pillar within the first opening prior to forming the second stack;
forming a second region of the channel-material-pillar within the second opening prior to forming the third stack; and
forming a third region of the channel-material-pillar within the third opening.

17. The method of claim 10 further comprising:
forming a first portion of a first feature to extend through the first and second stacks after forming the second stack; and
forming a second portion of the first feature to extend through the third stack and to be directly against the first portion of the first feature.

18. The method of claim 17 wherein the first feature is a pillar.

19. The method of claim 17 wherein the first feature is a panel.

20. The method of claim 17 wherein the first feature comprises sacrificial material; and further comprising replacing at least some of the sacrificial material with insulative material.

21. The method of claim 17 wherein the first feature comprises sacrificial material; and further comprising replacing at least some of the sacrificial material with conductive material.

22. The method of claim 10 wherein the insulative second, fourth and sixth materials comprise a same composition as one another.

23. The method of claim 22 wherein said same composition comprises silicon dioxide.

24. The method of claim 10 wherein the first, third and fifth materials comprise a same composition as one another.

25. The method of claim 24 wherein said same composition comprises silicon nitride.

\* \* \* \* \*